United States Patent
Antonyan

(10) Patent No.: US 10,453,532 B1
(45) Date of Patent: Oct. 22, 2019

(54) RESISTIVE MEMORY DEVICE INCLUDING REFERENCE CELL AND METHOD OF OPERATING THE SAME

(71) Applicant: SAMSUNG ELECTRONICS CO., LTD., Suwon-si, Gyeonngi-do (KR)

(72) Inventor: Artur Antonyan, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/130,358

(22) Filed: Sep. 13, 2018

(30) Foreign Application Priority Data

May 10, 2018 (KR) ........................ 10-2018-0053928

(51) Int. Cl.
| | |
|---|---|
| G11C 16/04 | (2006.01) |
| G11C 11/16 | (2006.01) |
| G11C 11/15 | (2006.01) |
| H01L 27/11521 | (2017.01) |
| G11C 16/10 | (2006.01) |
| H01L 27/11526 | (2017.01) |
| G11C 16/08 | (2006.01) |

(52) U.S. Cl.
CPC .......... *G11C 16/0433* (2013.01); *G11C 11/15* (2013.01); *G11C 11/1673* (2013.01); *G11C 16/08* (2013.01); *G11C 16/10* (2013.01); *H01L 27/11521* (2013.01); *H01L 27/11526* (2013.01)

(58) Field of Classification Search
CPC . G11C 16/0433; G11C 11/15; G11C 11/1673; G11C 16/08; G11C 16/10; H01L 27/11521; H01L 27/11526

USPC ........................................................ 365/158
See application file for complete search history.

(56) References Cited

U.S. PATENT DOCUMENTS

| | | | |
|---|---|---|---|
| 6,317,376 | B1 | 11/2001 | Tran et al. |
| 7,423,898 | B2 * | 9/2008 | Tanizaki ................. G11C 11/56 365/148 |
| 7,453,719 | B2 | 11/2008 | Sakimura et al. |
| 8,410,526 | B2 | 4/2013 | Shimizu |
| 9,384,843 | B2 | 7/2016 | Tsai |
| 9,390,793 | B1 | 7/2016 | Nigam et al. |
| 9,406,367 | B2 | 8/2016 | Chih et al. |
| 9,460,786 | B2 * | 10/2016 | Kang .................... G11C 13/004 |
| 2016/0379708 | A1 | 12/2016 | Katayama |
| 2017/0062032 | A1 | 3/2017 | Seo et al. |
| 2018/0025778 | A1 * | 1/2018 | Mori ................... G11C 13/0002 365/148 |

* cited by examiner

*Primary Examiner* — Fernando Hidalgo
(74) *Attorney, Agent, or Firm* — F. Chau & Associates, LLC

(57) ABSTRACT

A resistive memory device includes a plurality of word lines, a plurality of reference cells, a plurality of first resistive memory cells, a plurality of second resistive memory cells maintained in an off state, a read circuit configured to provide a first read current to the first resistive memory cells and provide a second read current to the reference cells while one of the first resistive memory cells is selected to perform a read operation, and a compensation circuit configured to provide a compensation current based on a first leakage current from the off resistive memory cells to the reference cells to compensate for a second leakage current generated by the unselected first resistive memory cells. Each reference cell is connected to one of the word lines and each of the first resistive memory cells are connected to one of the word lines.

20 Claims, 16 Drawing Sheets

RESISTIVE MEMORY DEVICE INCLUDING REFERENCE CELL AND METHOD OF OPERATING THE SAME

CROSS-REFERENCE TO RELATED APPLICATION

This U.S. application claims the benefit of and priority under 35 U.S.C. § 119 to Korean Patent Application No. 10-2018-0053928, filed on May 10, 2018, in the Korean Intellectual Property Office, the disclosure of which is incorporated by reference in its entirety herein.

BACKGROUND

1. Technical Field

The inventive concept relates to a resistive memory device, and more particularly, to a resistive memory device including a reference cell and a method of operating the resistive memory device.

2. Discussion of Related Art

A resistive memory device stores data in a memory cell including a variable resistance element. A read current may be supplied to the memory cell to read the data stored in the memory cell of the resistive memory device. For example, a read voltage may be detected due to the read current and the variable resistance element of the memory cell. Since the resistive memory device detects the data stored in the memory cell using the read current, a leakage current caused by process-voltage-temperature (PVT) variations may degrade reliability of a read operation.

SUMMARY

Embodiments of the inventive concept provide a resistive memory device, which may precisely read values stored in a memory cell at high speed, and a method of operating the resistive memory device.

An exemplary embodiment of the inventive concept provides a resistive memory device including: a plurality of word lines; a plurality of reference cells, where each reference cell is connected to one of the word lines; a plurality of first resistive memory cells, where each first resistive memory cell is connected to one of the word lines; a plurality of second resistive memory cells maintained in an off state; a read circuit configured to provide a first read current to the first resistive memory cells and provide a second read current to the reference cells while one of the first resistive memory cells is selected to perform a read operation; and a compensation circuit configured to withdraw a compensation current from the reference cells based on a first leakage current generated by the second resistive memory cells to compensate for a second leakage current generated by the unselected first resistive memory cells.

An exemplary embodiment of the inventive concept provides a resistive memory device including: a plurality of word lines; a plurality of reference cells, where each reference cell is connected to one of the word lines; a plurality of first resistive memory cells, where each first resistive memory cell is connected to one of the word lines; a plurality of second resistive memory cells maintained in an off state; a read circuit configured to provide a first read current to the first resistive memory cells and provide a second read current to the reference cells while one of the first resistive memory cells is selected to perform a read operation; and a compensation circuit configured to provide a compensation current based on a first leakage current from the off resistive memory cells to the reference cells to compensate for a second leakage current generated by the unselected first resistive memory cells.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
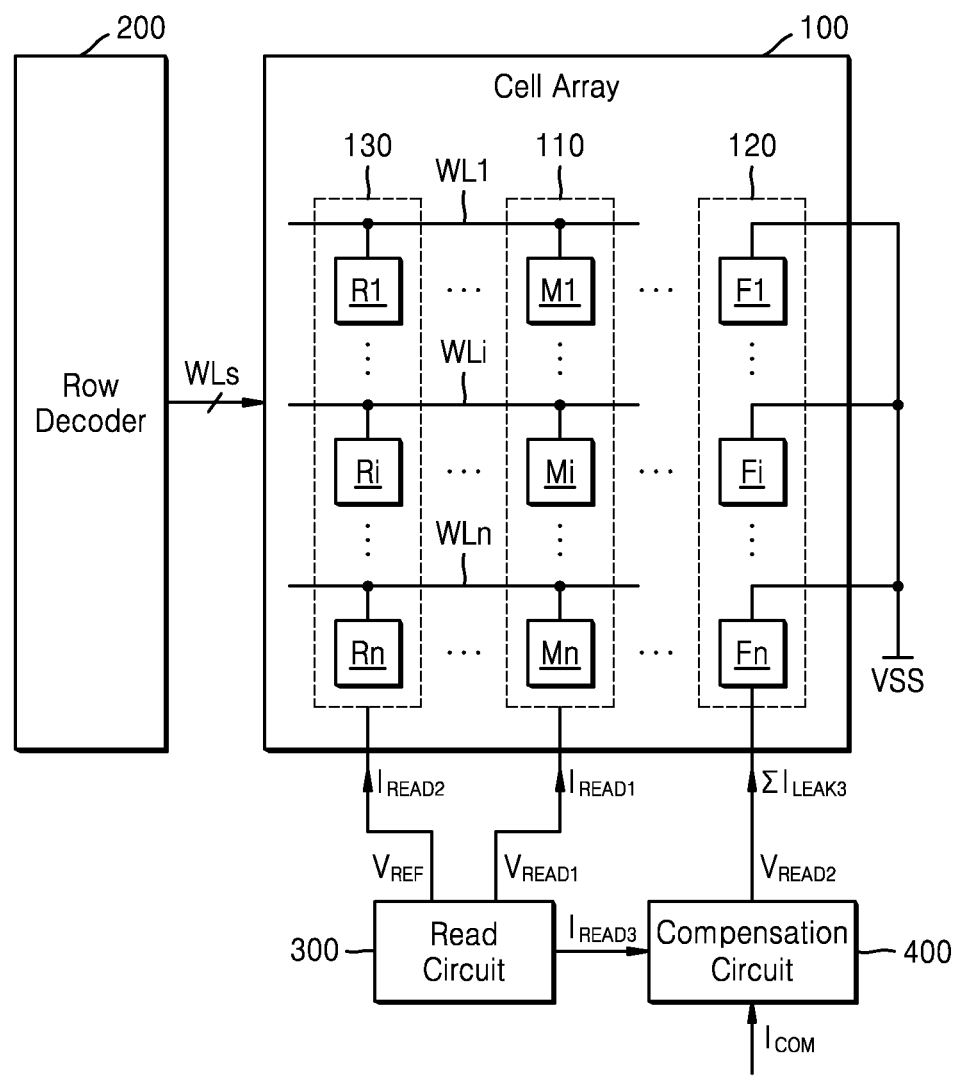
FIG. 1 is a block diagram of a memory device according to an exemplary embodiment of the inventive concept.

FIG. 1 is a block diagram of a memory device 10 according to an exemplary embodiment of the inventive concept. Specifically, FIG. 1 illustrates a cell array 100, a row decoder 200 (e.g., a row decoding circuit), a read circuit 300, and a compensation circuit 400 as some components included in the memory device 10.

The memory device 10 may receive a command and an address from an outside source and receive or output data. For example, the memory device 10 may receive a command, such as a write command or a read command, and an address corresponding to the command. For example, the address may indicate a location within the cell array 100 to write or read data. The memory device 10 may receive data in response to the write command, and output data in response to the read command. In some embodiments, the command, the address, and the data may be received or transmitted via independent channels. In some embodiments, at least two of the command, the address, and the data may be received or transmitted via the same channel.

The cell array 100 includes a plurality of memory cells (e.g., M1, Mi, and Mn). In an embodiment, each of the memory cells includes a variable resistance element (e.g., MTJ of FIG. 2) having a resistance corresponding to a value stored in the memory cell. Thus, the memory device 10 may be referred to as a resistive memory device or a resistive random access memory (RRAM or ReRAM) device. For example, the memory device 10 may include a cell array 100 having a structure, such as phase-change random access memory (PRAM) and ferroelectric RAM (FRAM), or include a cell array 100 having a magnetic RAM (MRAM) structure, such as spin-transfer torque MRAM (STT-MRAM), spin torque transfer magnetization switching RAM (STS-RAM), and spin momentum transfer RAM (SMT-RAM), but the inventive concept is not limited thereto. Exemplary embodiments of the inventive concept will mainly be described with reference to MRAM as described below with reference to FIGS. 2 and 3, but it should be noted that the inventive concept is not limited thereto.

The cell array 100 includes a first column 110 including a plurality of memory cells M1 to Mn, a second column 120 including a plurality of off cells F1 to Fn, and a third column 130 including a plurality of reference cells R1 to Rn (n is an integer more than 1). In addition to the first column 110, the cell array 100 may further include a plurality of columns including memory cells. In an exemplary embodiment, the cell array 100 includes at least two columns including reference cells. In an exemplary embodiment, the cell array 100 includes at least two columns including off cells. A cell of the cell array 100 is referred to as an off cell (e.g., F1) to indicate that the cell is similar (e.g., has same structure) to a memory cell (e.g., M1), but is disconnected from the existing word lines (e.g., WL1) and controlled by a voltage (e.g., VSS) that keeps the cell in an off state. For example, while a gate of a cell transistor (e.g., see CT in FIG. 4) in a memory cell (e.g., M1) is connected to a word line (e.g., WL1) so that cell transistor can be turned on or off by a voltage applied to the word line, a gate of the cell transistor in an off cell receives a voltage (e.g., VSS) that keeps the cell transistor in an off state (i.e., prevents the cell transistor from turning on).

The plurality of memory cells M1 to Mn included in the first column 110 may share a bit line (e.g., BLi of FIG. 6) and a source line (e.g., SLi of FIG. 6) with each other and be mutually exclusively selected by a plurality of word lines WLs. The row decoder 200 may enable one of the plurality of word lines WLs in response to an address received together with a read command, and memory cells connected to the enabled word line may be selected. For example, the plurality of word lines WLs may include n word lines WL1 to WLn, and a memory cell Mi may be selected by an enabled word line WLi (1≤i≤n). In the example of FIG. 1, the enabled word line WLi may have a high-level voltage (e.g., approximately a positive supply voltage VDD), while other disabled word lines (e.g., a first word line WL1) may have a low-level voltage (e.g., approximately a negative supply voltage VSS). As used herein, it is assumed that an enabled word line has a positive supply voltage VDD and a disabled word line (e.g., WL1 and WLn) has a negative supply voltage VSS (or a ground voltage). For example, when data is to be written to memory cell Mi, the row decoder applies VDD to a word line WLi and applies VSS to the remaining word lines (e.g., WL1 and WLn).

Like the plurality of memory cells M1 to Mn included in the first column 110, the plurality of reference cells R1 to Rn included in the third column 130 may share a bit line (e.g., BLr of FIG. 6) and a source line (e.g., SLr of FIG. 6) with each other and be mutually exclusively selected by the plurality of word lines WLs. A reference cell Ri selected by the word line WLi may provide the same environment (e.g., a path through which a read current flows) as the memory cell Mi selected by the same word line WLi, thereby reducing errors in an operation of reading a value stored in the memory cell Mi.

In an embodiment, a bit line (e.g., BLf in FIG. 6) and a source line (e.g., SLf in FIG. 6) are shared among the plurality of off cells F1 to Fn included in the second column 120. The plurality of off cells F1 to Fn are not connected to the plurality of word lines WLs, and the negative supply voltage VSS is applied to the plurality of off cells F1 to Fn. In an embodiment, an off cell Fi includes the same elements as the memory cell Mi so that each of the off cells F1 to Fn of the second column 120 have the same structure as an unselected memory cell. In an embodiment, the second column 120 include off cells in a greater or smaller number than the number of the plurality of memory cells M1 to Mn of the first column 110. As described below, the plurality of off cells F1 to Fn of the second column 120 may be used to emulate a leakage current generated by the first column 110.

During a read operation, the read circuit 300 provides a first read current $I_{READ1}$ to the first column 110 and provides a second read current $I_{READ2}$ to the third column 130. In an embodiment, a magnitude of the first read current $I_{READ1}$ is equal to a magnitude of the second read current $I_{READ2}$. The first read current $I_{READ1}$ may pass through the selected memory cell Mi of the first column 110 to generate a first read voltage $V_{READ1}$, and the second read current $I_{READ2}$ may pass through the selected reference cell Ri of the third column 130 to generate a reference voltage $V_{REF}$. In an embodiment, the read circuit 300 compares the first read voltage $V_{READ1}$ with the reference voltage $V_{REF}$ to determine a value stored in the memory cell Mi. Although only the read circuit 300 is illustrated in FIG. 1, the memory device 10 may further include a write circuit configured to provide a write current and/or a write voltage to the first column 110. In an embodiment, the read circuit 300 is replaced with a write/read circuit in which the write circuit and the read circuit 300 are implemented as a single block.

As described below with reference to FIG. 4, a leakage current may be generated by unselected memory cells (e.g., M1 and Mn) from among the memory cells M1 to Mn of the first column 11. Despite voltages of disabled word lines (e.g., WL1 and WLn), a leakage current may be generated by the unselected memory cells (e.g., M1 and Mn) due to various causes, for example, process-voltage-temperature (PVT) variations. Thus, current having a magnitude obtained by excluding the leakage current from the first read current $I_{READ1}$ provided by the read circuit 300 may pass through the selected memory cell Mi. On the other hand, a leakage current may be generated by unselected reference cells (e.g., R1 and Rn) from among the reference cells R1 to Rn of the third column 130. However, as described below with reference to FIG. 4, a magnitude of the leakage current generated by the third column 130 due to a reference cell having a different structure from a memory cell may be different from a magnitude of the leakage current generated by the first column 110. In an embodiment, the second read current $I_{READ2}$ is equal to a reference current flowing through a reference resistor. Accordingly, the reference voltage $V_{REF}$ may be independent of the leakage current generated by the unselected reference cells (e.g., R1 and Rn). As a result, the first read voltage $V_{READ1}$ and/or the reference voltage $V_{REF}$ may be maintained as expected values or drop from the expected values due to the leakage currents. Thus, errors may occur in a read operation.

The compensation circuit 400 provides a second read voltage $V_{READ2}$ to the second column 120. Due to the second read voltage $V_{READ2}$, a leakage current $\Sigma I_{LEAK3}$ may be generated by the plurality of off cells F1 to Fn of the second column 120. To generate the second read voltage $V_{READ2}$ corresponding to the first read voltage $V_{READ1}$, the compensation circuit 400 may receive a third read current $I_{READ3}$ from the read circuit 300 and include a resistor (e.g., $R_{EMU}$ of FIG. 8) through which the third read current $I_{READ3}$ passes. In an embodiment, the third read current $I_{READ3}$ has the same magnitude as the first read current $I_{READ1}$ and/or the second read current $I_{READ2}$. The compensation circuit 400 may generate a compensation current $I_{COM}$ having the same magnitude as the leakage current $\Sigma I_{LEAK3}$ generated by the second column 120. The compensation circuit 400 may function as a current sink configured to withdraw the compensation current $I_{COM}$ from a source generating a leak current. For example, the compensation circuit 400 may withdraw the compensation current $I_{COM}$ from the second read current $I_{READ2}$ generated by the read circuit 300 so that the reference voltage $V_{REF}$ drops as much as the first read voltage $V_{READ1}$ drops due to the leakage current generated by the first column 110.

During a read operation of the memory cell Mi, the leakage current generated by the first column 110 may be precisely emulated by the plurality of off cells F1 to Fn having the same structure as the unselected memory cells (e.g., M1 and Mn). Also, a drop in the first read voltage $V_{READ1}$ due to the leakage current may be reflected as a drop in the reference voltage $V_{REF}$ due to the emulated leakage current so that errors caused by the leakage current of the first column 110 may be precisely compensated. Thus, errors caused by the leakage current may be automatically compensated at a high speed without an additional control section for compensating the leakage current.

The row decoder 200 may enable one of the plurality of word lines WLs in response to an externally received address. Thus, the plurality of memory cells M1 to Mn included in the first column 110 may be mutually exclusively selected by the enabled word line. Similarly, the plurality of reference cells R1 to Rn included in the third column 130 may also be mutually exclusively selected by the enabled word line. Memory cells connected to one word line may be referred to as a page.

Figure 2:
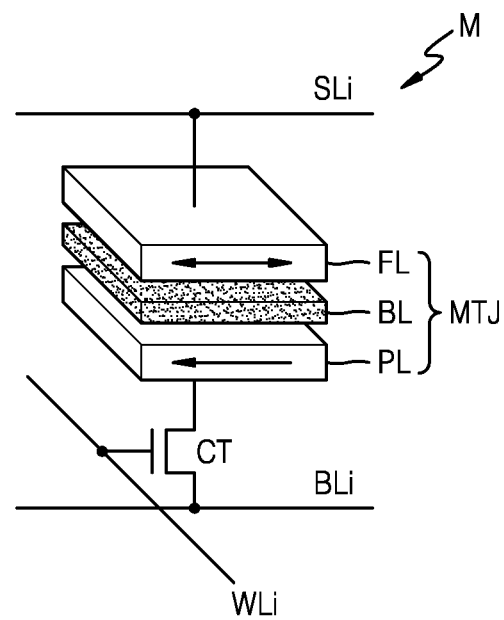
FIG. 2 is a diagram of an example of a memory cell included in a first column of FIG. 1, according to an exemplary embodiment of the inventive concept.
Figure 3:
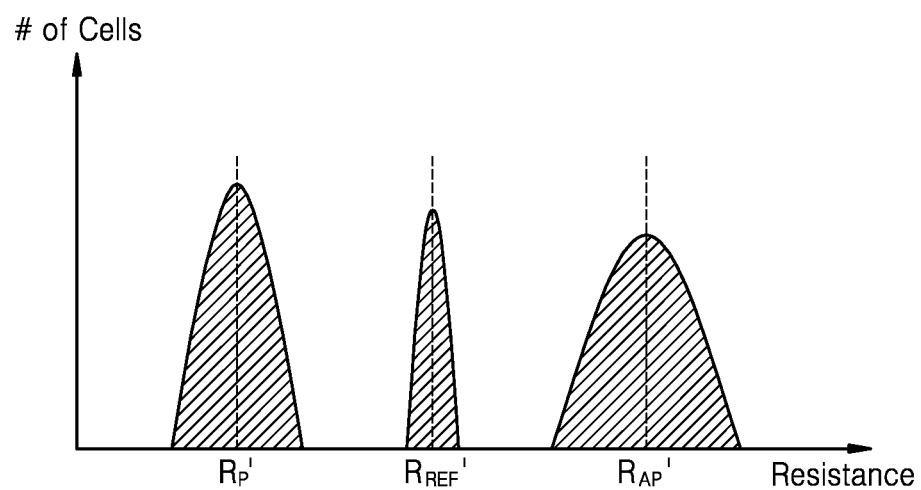
FIG. 3 is a graph showing distributions of resistances provided by a memory cell, according to an exemplary embodiment of the inventive concept.

FIG. 2 is a diagram of an example of a memory cell included in the first column 110 of FIG. 1, according to an exemplary embodiment of the inventive concept. FIG. 3 is a graph showing distributions of resistances provided by a memory cell, according to an exemplary embodiment of the inventive concept. Specifically, FIG. 2 illustrates a memory cell M including a magnetic tunnel junction (MTJ) element as a variable resistance element MTJ, and FIG. 3 is a graph of distributions of resistances of the variable resistance element MTJ of FIG. 2.

As shown in FIG. 2, the memory cell M includes a variable resistance element MTJ and a cell transistor CT, which may be connected in series between a source line SLi and a bit line BLi. In an exemplary embodiment, as shown in FIG. 2, the variable resistance element MTJ and the cell transistor CT are connected in sequential order between the source line SLi and the bit line BLi. In an exemplary embodiment, unlike that shown in FIG. 2, the cell transistor CT and the variable resistance element MTJ are connected in sequential order between the source line SLi and the bit line BLi.

In an embodiment, the variable resistance element MTJ includes a free layer FL and a pined layer PL and include a barrier layer BL located between the free layer FL and the pinned layer PL. As illustrated with arrows in FIG. 2, a magnetization direction of the pinned layer PL is fixed, while a magnetization direction of the free layer FL is the same as or opposite to the magnetization direction of the pinned layer PL. When the magnetization direction of the pinned layer PL is the same as the magnetization direction of the free layer FL, the variable resistance element MTJ is in a parallel state P, while the magnetization of the pinned layer PL is opposite to the magnetization direction of the free layer FL, the variable resistance element MTJ is in an anti-parallel state AP. In an embodiment, the variable resistance element MTJ further includes an anti-ferromagnetic layer so that the pinned layer PL has a pinned magnetization direction.

In an embodiment, t0he variable resistance element MTJ has a relatively low resistance $R_P$ in the parallel state P, while the variable resistance element MTJ has a relatively high resistance $R_{AP}$ in the anti-parallel state AP. As used herein, it is assumed that when the variable resistance element MTJ that is in the parallel state P has a low resistance $R_P$, the memory cell M stores '0,' while when the variable resistance element MTJ that is in the anti-parallel state AP has a high resistance $R_{AP}$, the memory cell M' stores '1.' As used herein, a resistance $R_P$ corresponding to '0' is referred to as a parallel resistance $R_P$, and a resistance $R_{AP}$ corresponding to '1' is referred to as an anti-parallel resistance $R_{AP}$.

The cell transistor CT includes a gate (or control terminal) connected to a word line WLi and a source and a drain, which are respectively connected to the bit line BLi and the variable resistance element MTJ. The cell transistor CT may allow or block electrical connection of the variable resistance element MTJ with the bit line BLi in response to a voltage applied to the word line WLi. For example, to write '0' to the memory cell M in a write operation, the enabled word line WLi has a positive supply voltage VDD so that current flowing through the turned-on cell transistor CT from the source line SLi to the bit line BLi passes through the variable resistance element MTJ. In addition, to write '1' to the memory cell M', the enabled word line WLi has the positive supply voltage VDD so that current flowing through the turned-on cell transistor CT from the bit line BLi to the source line SLi passes through the variable resistance element MTJ. In a read operation, the cell transistor CT is turned on, and current flowing from the source line SLi to the bit line BLi or current flowing from the bit line BLj to the source line SLi, that is, a read current, passes through the cell transistor CT and the variable resistance element MTJ. As used herein, it is assumed that the read current flows from the bit line BLi to the source line SLi.

A resistance of the variable resistance element MTJ is illustrated in FIG. 3 as a distribution. For example, as shown in FIG. 3, a distribution of parallel resistances $R_P$ having an average $R_P'$ is present in memory cells configured to store '0,' and a distribution of anti-parallel resistances $R_{AP}$ having an average $R_{AP}'$ is present in memory cells configured to store '1.' Also, a distribution of reference resistances having an average $R_{REF}'$ is present between the distribution of the parallel resistances $R_P$ and the distribution of the anti-parallel resistances $R_{AP}$. As described below with reference to FIG. 4, due to a reference cell including only a cell transistor and a reference resistor disposed outside a cell array, a reference resistance may have a better distribution (i.e., a distribution having a lower dispersion) than the resistances $R_P$ and $R_{AP}$ of the variable resistance element MTJ. In some embodiments, as shown in FIG. 3, the anti-parallel resistance $R_{AP}$ may have a worse distribution (i.e., a distribution having a higher dispersion) than the parallel resistance $R_P$.

Figure 4:
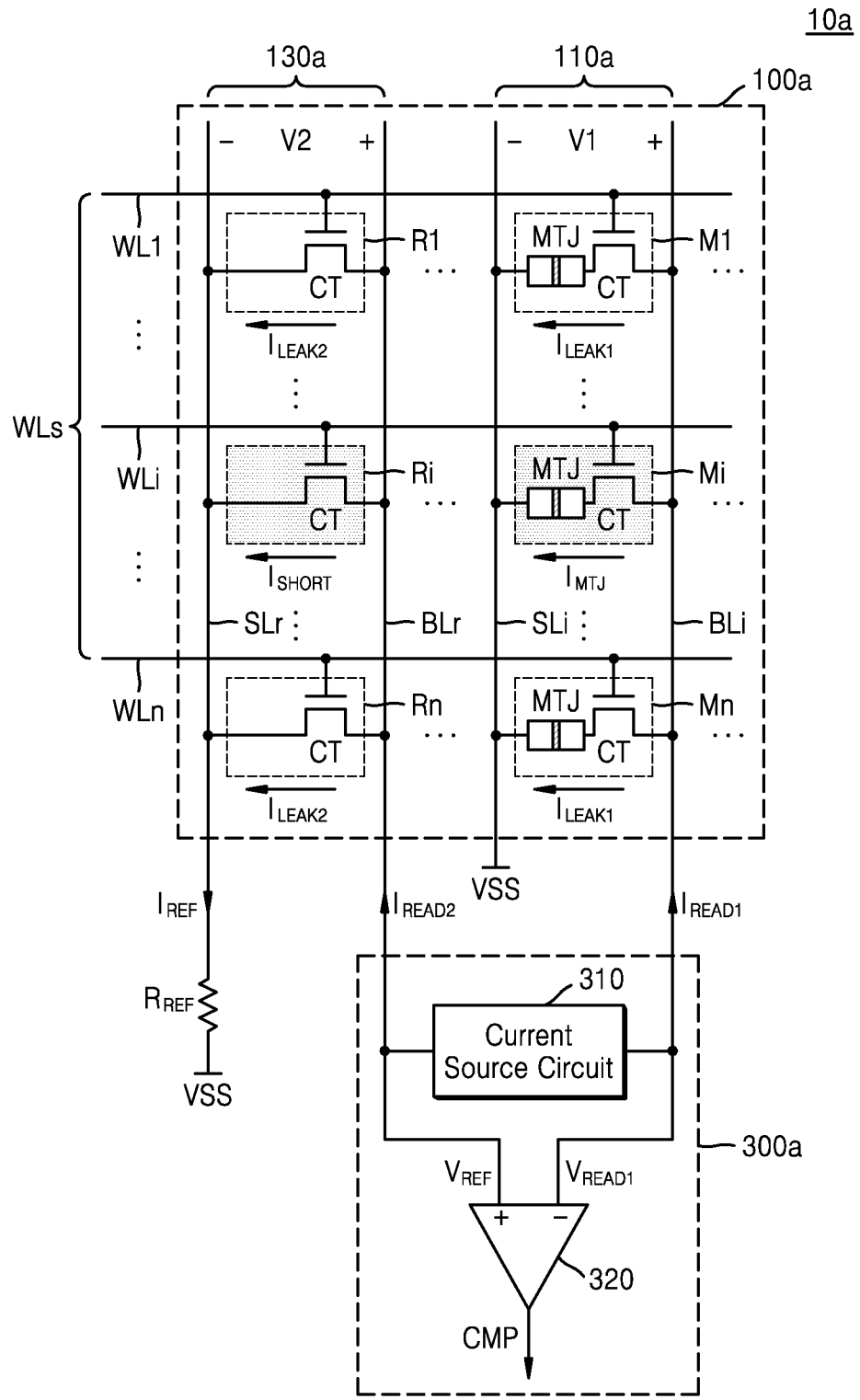
FIG. 4 is a block diagram of a memory device on which a read operation is performed, according to an exemplary embodiment of the inventive concept.
Figure 5:
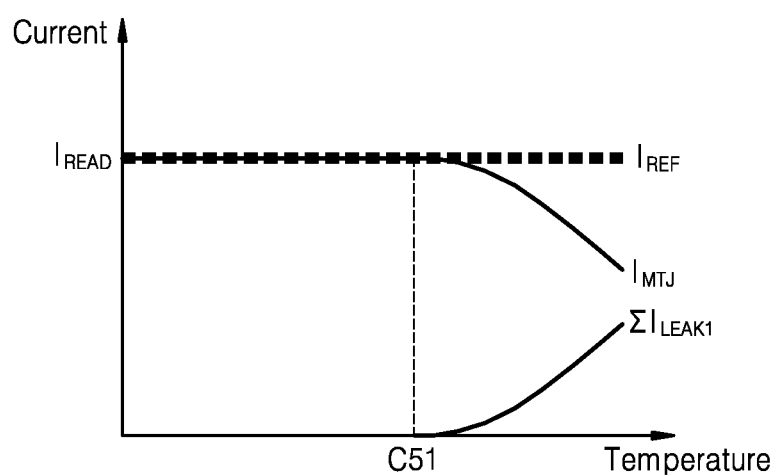
FIG. 5 shows graphs of currents and voltages of FIG. 4 with respect to temperature, according to an exemplary embodiment of the inventive concept.
Figure 5:
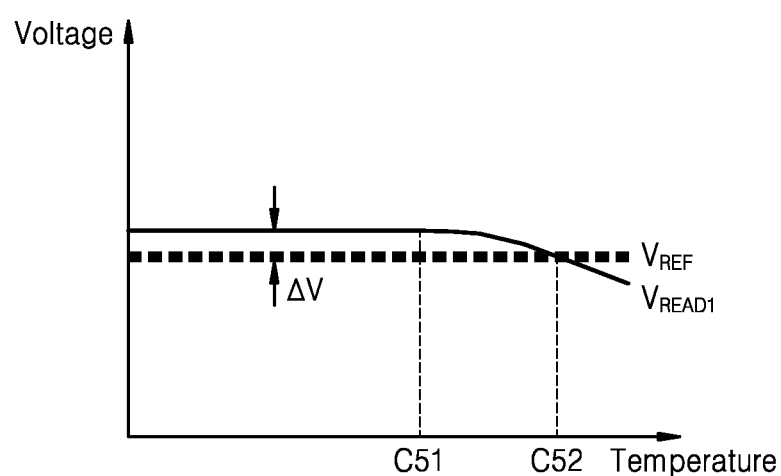

FIG. 4 is a block diagram of a memory device 10a on which a read operation is performed, according to an exemplary embodiment of the inventive concept. FIG. 5 shows graphs of currents and voltages of FIG. 4 with respect to temperature, according to an exemplary embodiment of the inventive concept.

Referring to FIG. 4, the memory device 10a includes a cell array 100a, a read circuit 300a, and a reference resistor $R_{REF}$. As described above with reference to FIG. 1, the cell array 100a receives a first read current $I_{READ1}$ and a second read current $I_{READ2}$ from the read circuit 300a, the read circuit 300a obtains a first read voltage $V_{READ1}$ from the first read current $I_{READ1}$ and obtains a reference voltage $V_{REF}$ from the second read current $I_{READ2}$.

The cell array 100a includes a first column 110a including a plurality of memory cells M1 to Mn (n is an integer more than 1), and the plurality of memory cells M1 to Mn of the first column 110a is connected to a bit line BLi and a source line SLi. As described above with reference to FIG. 2, each of the plurality of memory cells M1 to Mn includes an MTJ element MTJ and a cell transistor CT. Also, as shown in FIG. 4, a negative supply voltage VSS is applied to the source line SLi during the read operation. In an alternate embodiment, VSS is a ground voltage.

The cell array 100a includes a third column 130a including a plurality of reference cells R1 to Rn (n is an integer more than 1), and the plurality of reference cells R1 to Rn of the third column 130a are connected to the bit line BLr and the source line SLr. As shown in FIG. 4, each of the plurality of reference cells R1 to Rn includes a cell transistor CT, and the MTJ element MTJ is omitted unlike in the memory cells Mi to Mn. A reference cell from which the MTJ element MTJ is omitted may be referred to as a short cell. Also, as shown in FIG. 4, the source line SLr is connected to the reference resistor $R_{REF}$ during a read operation.

In an embodiment, the reference resistor $R_{REF}$ has one end connected to the third column 130a through the source line SLr and one end to which the negative supply voltage VSS is applied during a read operation. The reference resistor $R_{REF}$ has a reference resistance, and receives a reference current $I_{REF}$ through the source line SLr during the read operation. In an embodiment as described above with reference to FIG. 3, the reference resistance is equal to an intermediate value '$(R_P+R_{AP})/2$' between a parallel resistance $R_P$ and an anti-parallel resistance $R_{AP}$. Unlike a device (i.e., the MTJ element MTJ) configured to provide a resistance in the cell array 100a, in an exemplary embodiment, the reference resistor $R_{REF}$ is formed using a different material (e.g., polysilicon (poly-Si)) from the MTJ element MTJ to have a constant resistance. Thus, the reference resistor $R_{REF}$ is formed to have a desired resistance and have good characteristics, for example, higher insensitivity to PVT variations than the MTJ element MTJ. As shown in FIG. 4, the reference current $I_{REF}$ received through the source line SLr may be equal to the second read current $I_{READ2}$.

The read circuit 300a provides the first read current $I_{READ1}$ through the bit line BLi to the first column 110a, and the first read current $I_{READ1}$ flows from the bit line BLi through the plurality of memory cells M1 to Mn and the source line SLi to the negative supply voltage VSS. A memory cell Mi is selected by an enabled word line WLi of a plurality of word lines WLs, and a cell transistor CT of the memory cell Mi is turned on so that an MTJ current $I_{MTJ}$ flows through the memory cell Mi. On the other hand, a first leakage current $I_{LEAK1}$ may flow through each of unselected memory cells (e.g., M1 and Mn) due to the disabled word lines (e.g., WL1 and WLn) of the plurality of word lines WLs. Thus, the first read current $I_{READ1}$ may be expressed by Equation 1:

$$I_{READ1}=I_{MTJ}+\Sigma I_{LEAK1} \quad (1),$$

wherein '$\Sigma I_{LEAK1}$' denotes the sum of first leakage currents $I_{LEAK1}$ flowing through (n−1) unselected memory cells (e.g., M1 and Mn) in the first column 110a.

In addition, the read circuit 300a provides the second read current $I_{READ2}$ through the bit line BLr to the third column 130a, and the second read current $I_{READ2}$ flows from the bit line BLr through the plurality of reference cells R1 to Rn and the source line SLr to the reference resistor $R_{REF}$. Thus, the second read current $I_{READ2}$ may pass through a path that is similar to a path through which the first read current $I_{READ1}$ passes. A voltage drop, which occurs at the bit line BLi and the source line SLi of the first column 110a, may also occur at the bit line BLr and the source line SLr of the third column 130a. Thus, reliability of a read operation may be improved.

A reference cell Ri is selected by the enabled word line WLi of the plurality of word lines WLs, and a cell transistor CT of the reference cell Ri is turned on so that a short current $I_{SHORT}$ passes through the reference cell Ri. On the other hand, the second leakage current $I_{LEAK2}$ may flow through each of unselected reference cells (e.g., R1 and Rn) due to the disabled word lines (e.g., WL1 and WLn) of the plurality of word lines WLs. Thus, the second read current $I_{READ2}$ may be expressed as in Equation 2:

$$I_{READ2}=I_{MTJ}+\Sigma I_{LEAK2} \quad (2),$$

wherein '$\Sigma I_{LEAK2}$' denotes the sum of second leakage currents $I_{LEAK2}$ flowing through (n−1) unselected reference cells (e.g., R1 and R2) in the third column 130a.

In an exemplary embodiment, the read circuit 300a includes a current source circuit 310 and a comparator 320. The current source circuit 310 generates the first read current $I_{READ1}$ and the second read current $I_{READ2}$. The comparator 320 compares the first read voltage $V_{READ1}$ with the reference voltage $V_{REF}$ to generate a comparison signal CMP. When the MTJ element MTJ of the selected memory cell Mi has a parallel resistance $R_P$, the first read voltage $V_{READ1}$ is lower than the reference voltage $V_{REF}$. When the MTJ element MTJ of the selected memory cell Mi has an anti-parallel resistance $R_{AP}$, the first read voltage $V_{READ1}$ is higher than the reference voltage $V_{REF}$. Thus, a value of data stored in the selected memory cell Mi may be determined from the comparison signal CMP.

The first leakage current $I_{LEAK1}$ generated by the unselected memory cell (e.g., M1) and the second leakage current $I_{LEAK2}$ generated by the unselected reference cell (e.g., R1) may differently vary with a rise in temperature. Even if a negative supply voltage VSS is applied to the cell transistor CT included in each of the unselected memory cell Mi and the unselected reference cell R1, the cell transistor CT may generate a leakage current (i.e., a source-drain current) with a rise in temperature. The source-drain current may increase as a source-drain voltage of the cell transistor CT becomes higher. As shown in FIG. 4, a first voltage V1 between the bit line BLi and the source line SLi in the first column 110a may have a relatively high value (e.g., several hundred mV) due to a resistance of the MTJ element MTJ included in the memory cell Mi, while a second voltage V2 between the bit line BLr and the source line SLr in the third column 130a may have a relatively low value (e.g., several tens of mV) due to the reference cell Ri that is the short cell. Thus, the first leakage current $I_{LEAK1}$ may be larger than the second leakage current $I_{LEAK2}$ at a high temperature. In addition, the sum $\Sigma I_{LEAK2}$ of second leakage currents caused by the unselected reference cells (e.g., R1 and Rn) may be included in the reference current $I_{REF}$. Thus, the sum $\Sigma I_{LEAK2}$ of second leakage currents may pass through the reference resistor $R_{REF}$ and contribute to formation of the reference voltage $V_{REF}$.

As illustrated with a dashed line in an upper graph of FIG. 5, despite the sum $\Sigma I_{LEAK2}$ of the second leakage currents generated by the unselected reference cells (e.g., R1 and Rn), the reference current $I_{REF}$ passing through the reference resistor $R_{REF}$ maintains a magnitude $I_{READ}$ of the second read current $I_{READ2}$ with a rise in temperature. On the other hand, as described above, the sum $\Sigma I_{LEAK1}$ of the first leakage currents passing through the unselected memory cells (e.g., M1 and Mn) gradually increases at a first temperature C51 or higher. Thus, the MTJ current $I_{MTJ}$ passing through the selected memory cell Mi is gradually reduced at the first temperature C51 or higher.

Referring to a lower graph of FIG. 5, assuming that the MTJ element MTJ included in the selected memory cell Mi has an anti-parallel resistance $R_{AP}$ higher than a parallel resistance $R_P$, the first read voltage $V_{READ1}$ may be higher than the reference voltage $V_{REF}$ at the first temperature C51 or lower, and a voltage difference $\Delta V$ between the first read voltage $V_{READ1}$ and the reference voltage $V_{REF}$ may be larger than an input voltage margin of the comparator 320. Since the reference current Ii is maintained constant with a rise in temperature, the reference voltage VF may be also maintained constant with a rise in temperature. On the other hand, since the MTJ current $I_{MTJ}$ passing through the selected memory cell Mi is gradually reduced at the first temperature C51 or higher, the first read voltage $V_{READ1}$ may be also gradually reduced at the first temperature C51 or higher. Accordingly, the voltage difference $\Delta V$ between the first read voltage $V_{READ1}$ and the reference voltage $V_{REF}$ may be gradually reduced at the first temperature C51 or higher, and the first read voltage $V_{READ1}$ may be even lower than the reference voltage VF at a second temperature C52. As a result, errors may occur in a read operation of the read circuit 300a at the first temperature C51 or higher. Although a leakage current caused by a temperature variation has been described above with reference to FIGS. 4 and 5, a leakage current may occur due to other factors, for example, process and voltage variations, and also cause errors in the read operation.

Figure 6:
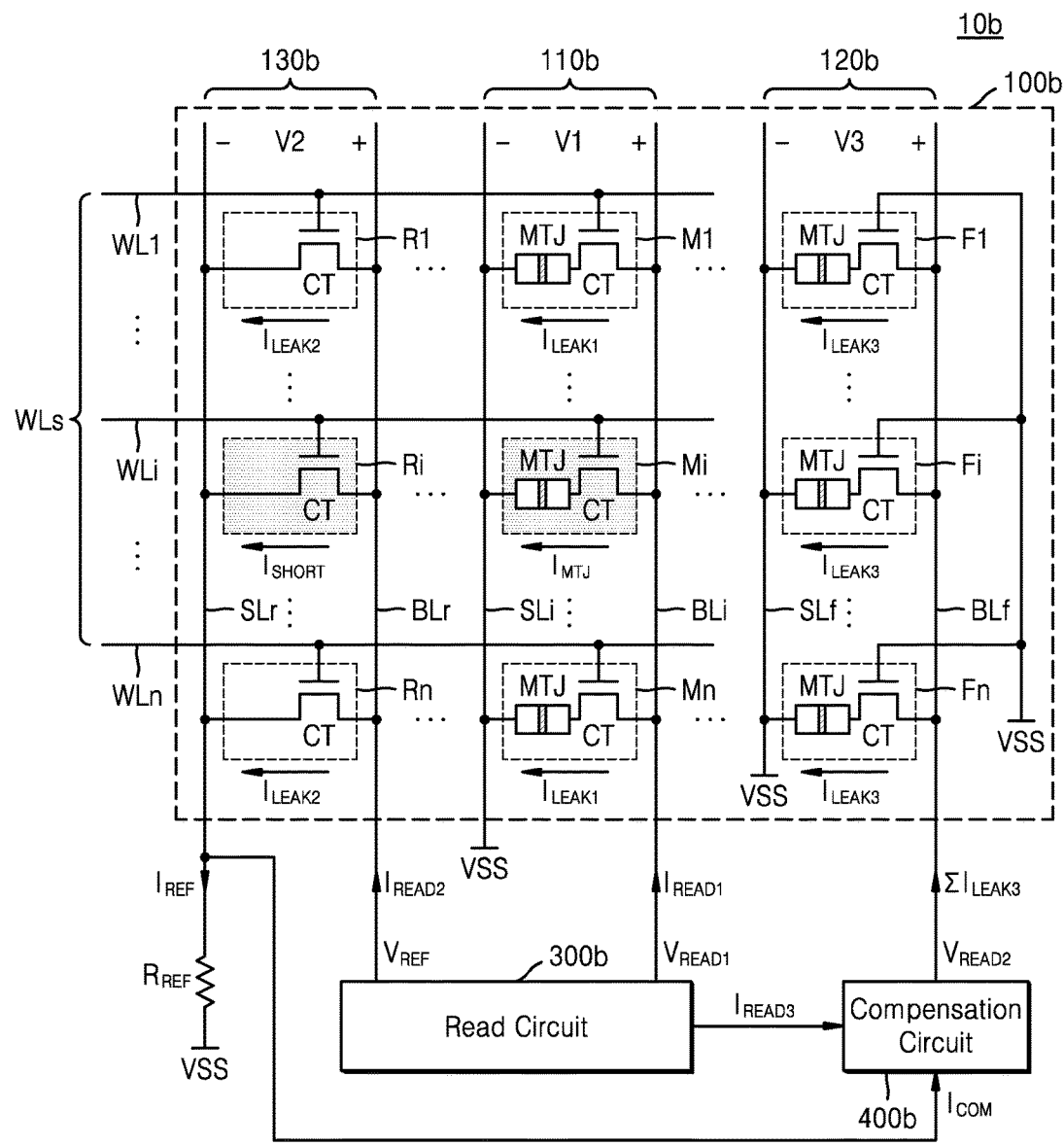
FIG. 6 is a block diagram of a memory device on which a read operation is performed, according to an exemplary embodiment of the inventive concept.
Figure 7:
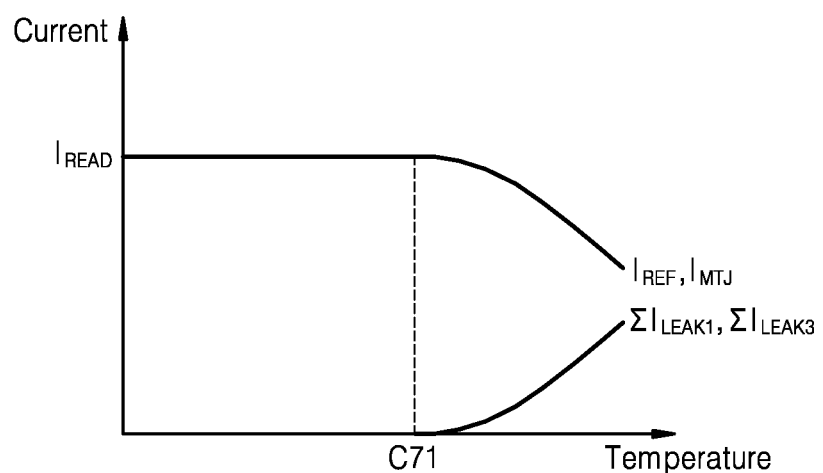
FIG. 7 shows graphs of currents and voltages of FIG. 6 with respect to temperature, according to an exemplary embodiment of the inventive concept.
Figure 7:
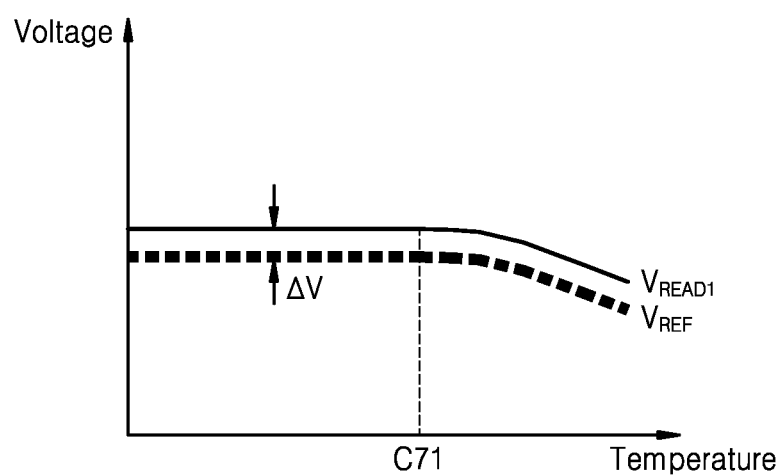

FIG. 6 is a block diagram of a memory device 10b on which a read operation is performed, according to an exemplary embodiment of the inventive concept. FIG. 7 shows graphs of currents and voltages of FIG. 6 with respect to temperature, according to an exemplary embodiment of the inventive concept. As compared with the memory device 10a of FIG. 5, the memory device 10b of FIG. 6 further includes a compensation circuit 400b, and a cell array 100b further includes a second column 120b including a plurality of off cells F1 to Fn. In the following descriptions of FIGS. 6 and 7, the same descriptions as in FIGS. 4 and 5 will be omitted.

Referring to FIG. 6, the memory device 10b includes a cell array 100b, a read circuit 300b, a compensation circuit 400b, and a reference resistor $R_{REF}$. The cell array 100b receives a first read current $I_{READ1}$ and a second read current $I_{READ2}$ from the read circuit 300b and receives a second read voltage $V_{READ2}$ from the compensation circuit 400b.

The cell array 100b includes a first column 110b, a second column 120b, and a third column 130b. The second column 120b includes a plurality of off cells F1 to Fn (n is an integer more than 1), and the plurality of off cells F1 to Fn of the second column 120b are connected to a bit line BLf and a source line SLf. As shown in FIG. 6, a negative supply voltage VSS is applied to the source line SLf. Each of the plurality of off cells F1 to Fn include an MTJ element MTJ and a cell transistor CT like a memory cell (e.g., M1), and the cell transistor CT has a gate to which the negative supply voltage VSS is applied. Thus, each of the plurality of off cells F1 to Fn have the same structure as an unselected memory cell (e.g., M1).

The compensation circuit 400b may receive a third read current $I_{READ3}$ from the read circuit 300b. In an embodiment, the third read current $I_{READ3}$ has the same magnitude as the first read current $I_{READ1}$ and/or the second read current $I_{READ2}$. The compensation circuit 400b may generate a second read voltage $V_{READ2}$ based on the third read current $I_{READ3}$, and provide the second read voltage $V_{READ2}$ to the bit line BLf of the second column 120b. In an embodiment, the second read voltage $V_{READ2}$ has substantially the same magnitude as a first read voltage $V_{READ1}$, and a third voltage V3 between the bit line BLf and the source line SLf of the second column 120b has substantially the same magnitude as a first voltage V1 between a bit line BLi and a source line SLi of the first column 110b. The voltages V1-V3 may be provided by a voltage generator (not shown). Thus, a third leakage current $I_{LEAK3}$ passing through each of the plurality of off cells F1 to Fn of the second column 120b may have substantially the same magnitude as a first leakage current $I_{LEAK1}$ passing through each of unselected memory cells (e.g., M1 and Mn) of a plurality of memory cells M1 to Mn of the first column 110b. As used herein, the sum $\Sigma I_{LEAK3}$ of third leakage currents passing through the plurality of off cells F1 to Fn may be referred to as an emulation leakage current. The emulation leakage current $\Sigma I_{LEAK3}$ may have substantially the same magnitude as the sum $\Sigma I_{LEAK1}$ of first leakage currents. In an embodiment, since the number of the unselected memory cells is (n−1) in the first column 110b, the second column 120b includes only (n−1) off cells.

The compensation circuit 400b generates a compensation current $I_{COM}$ having the same magnitude as the emulation leakage current $\Sigma I_{LEAK3}$ and functions as a current sink configured to withdraw the compensation current $I_{COM}$. As shown in FIG. 6, the compensation circuit 400b may be connected to the reference resistor $R_{REF}$ and withdraw the compensation current $I_{COM}$ from the second read current $I_{READ2}$. Thus, a reference current $I_{REF}$ passing through the reference resistor $R_{REF}$ may be expressed as in Equation 3:

$$I_{REF}=I_{READ2}-I_{COM}=I_{READ2}-\Sigma I_{LEAK3} \qquad (3).$$

Referring to an upper graph of FIG. 7, as described above with reference to FIG. 5, the sum $\Sigma I_{LEAK1}$ of the first leakage currents passing through the unselected memory cells (e.g., M1 and Mn) may gradually increase at a first temperature C71 or higher. Thus, an MTJ current $I_{MTJ}$ passing through a selected memory cell Mi may be gradually reduced at the first temperature C71 or higher. Since the sum $\Sigma I_{LEAK1}$ of the first leakage currents gradually increases at a first temperature C71 or higher, as shown in FIG. 7, the emulation leakage current $\Sigma I_{LEAK3}$ may also increase. Thus, the reference current $I_{REF}$ passing through the reference resistor $R_{REF}$ may be gradually reduced at the first temperature C71 or higher like the MTJ current $I_{MTJ}$.

Referring to a lower graph of FIG. 7, assuming that an MTJ element MTJ included in the selected memory cell Mi has an anti-parallel resistance $R_{AP}$ higher than a parallel resistance $R_P$, the first read voltage $V_{READ1}$ may be higher than the reference voltage $V_{REF}$ by a voltage difference $\Delta V$ at the first temperature C71 or lower. Since the MTJ current $I_{MTJ}$ passing through the selected memory cell Mi is gradually reduced at the first temperature C71 or higher, the first read voltage $V_{READ1}$ may be also gradually reduced at the first temperature C71 or higher. Also, since the reference current $I_{REF}$ passing through the reference resistor $R_{REF}$ is gradually reduced at the first temperature C71 or higher, the reference voltage $V_{REF}$ may be also gradually reduced at the first temperature C71 or higher. Thus, the voltage difference $\Delta V$ between the first read voltage $V_{READ1}$ and the reference voltage $V_{REF}$ may be maintained even at the first temperature C71 or higher. As a result, errors in the read operation, which are described above with reference to FIG. 5, may be prevented.

Figure 8:
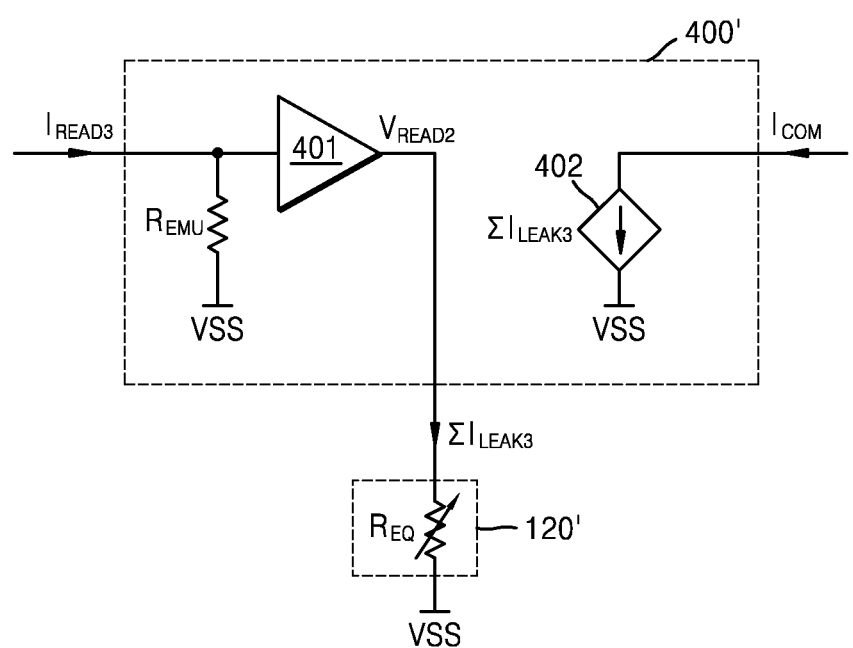
FIG. 8 is an equivalent circuit diagram of a compensation circuit of FIG. 1, according to an exemplary embodiment of the inventive concept.

FIG. 8 is an equivalent circuit diagram of the compensation circuit 400 of FIG. 1, according to an exemplary embodiment of the inventive concept. As described above with reference to FIG. 6, a compensation circuit 400' of FIG. 8 receives a third read current $I_{READ3}$ and provides a second read voltage $V_{READ2}$ to a second column 120'. Also, the compensation circuit 400' may withdraw a compensation current $I_{COM}$ having the same magnitude as an emulation leakage current $\Sigma I_{LEAK3}$ from the outside. As shown in FIG. 8, the compensation circuit 400' includes an emulation resistor $R_{EMU}$, a voltage buffer 401, and a variable current source 402. The second column 120' including off cells may be expressed as an equivalent resistor $R_{EQ}$ having a variable resistance according to temperature. Hereinafter, FIG. 8 will be described with reference to FIG. 6.

The third read current $I_{READ3}$ passes through the emulation resistor $R_{EMU}$ to the negative supply voltage VSS, and a voltage corresponding to a first read voltage $V_{READ1}$ may be applied to the voltage buffer 401. The emulation resistor $R_{EMU}$ may have a resistance falling within the range of resistances exhibited by an MTJ element MTJ of a memory cell Mi. In an embodiment, a resistance of the emulation resistor $R_{EMU}$ ranges from a parallel resistance $R_P$ to an anti-parallel resistance $R_{AP}$. In an embodiment, the resistance of the emulation resistor $R_{EMU}$ is equal to an intermediate value '$(R_P+R_{AP})/2$' between the parallel resistance $R_P$ and the anti-parallel resistance $R_{AP}$. In an embodiment, as described below with reference to FIG. 10, to emulate a decreasing first read voltage $V_{READ1}$ at a high temperature, the emulation resistor $R_{EMU}$ is configured to have a decreasing resistance at a high temperature.

The voltage buffer 401 may have a high input impedance and output the second read voltage $V_{READ2}$ having the same magnitude as the voltage generated by the third read current $I_{READ3}$ and the emulation resistor $R_{EMU}$. As shown in FIG. 8, the second read voltage $V_{READ2}$ may be provided, and the voltage buffer 401 may output the emulation leakage current $\Sigma I_{LEAK3}$ due to an equivalent resistance $R_{EQ}$ of the second column 120'.

In an embodiment, the variable current source 402 serves as a current sink and generates current having the same magnitude as the emulation leakage current $\Sigma I_{LEAK3}$ output by the voltage buffer 401 so that a compensation current $I_{COM}$ is generated. As described above with reference to FIGS. 5 and 7, when the leakage current caused by the off cells included in the second column 120' increases with a rise in temperature, that is, when a resistance of the equivalent resistor $R_{EQ}$ is reduced, the emulation leakage current $I_{LEAK3}$ may increase, and the compensation current $I_{COM}$ may also increase due to the variable current source 402.

Figure 9:
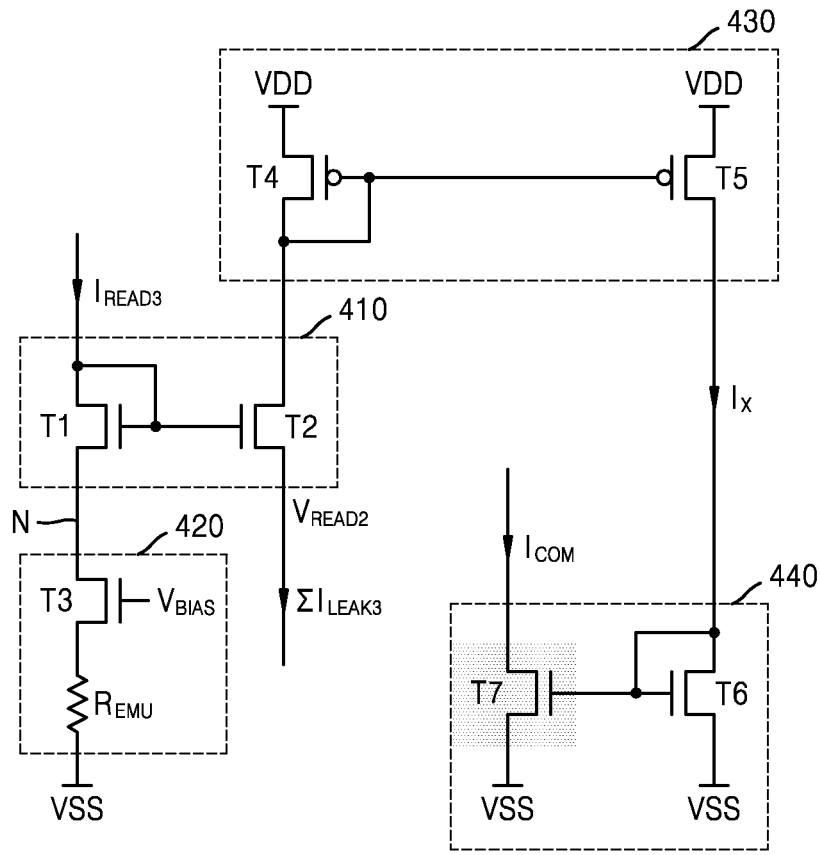
FIG. 9 is a circuit diagram of an example of the compensation circuit of FIG. 1, according to an exemplary embodiment of the inventive concept.

FIG. 9 is a circuit diagram of an example of the compensation circuit 400 of FIG. 1, according to an exemplary embodiment of the inventive concept. As described above with reference to FIG. 8, a compensation circuit 400" of FIG. 9 receives a third read current $I_{READ3}$ and generates an emulation leakage current $\Sigma I_{LEAK3}$ and a compensation current $I_{COM}$. As shown in FIG. 9, the compensation circuit 400" includes a voltage buffer 410, an emulation resistor circuit 420, a first current mirror 430, and a second current mirror 440. In the compensation circuit 400", components other than the emulation resistor circuit 420, that is, the voltage buffer 410, the first current mirror 430, and the second current mirror 440, may be referred to collectively as a conversion circuit. According to an exemplary embodiment, the compensation circuit 400 of FIG. 1 includes circuits, which are different than in the compensation circuit 400" of FIG. 9 and perform the same functions as the equivalent circuit of FIG. 8. Hereinafter, FIG. 9 will be described with reference to FIG. 6.

The voltage buffer 410 receives the third read current $I_{READ3}$ and generates a second read voltage $V_{READ2}$. The voltage buffer 410 provides the received third read current $I_{READ3}$ to the emulation resistor circuit 420, buffers a voltage of a node N connected to the emulation resistor circuit 420, and outputs the buffered voltage as the second read voltage $V_{READ2}$. As shown in FIG. 9, the voltage buffer 410 includes a first transistor T1 and a second transistor T2, which have respective gates connected to each other. The first transistor T1 may have a drain to which the third read current $I_{READ3}$ is received, a gate connected to the drain, and a source connected to the emulation resistor circuit 420. The second transistor T2 may have a drain connected to the first current mirror 430, a gate connected to the gate of the first transistor T1, and a source from which the second read voltage $V_{READ2}$ is output.

The emulation resistor circuit 420 includes a third transistor T3 and an emulation resistor $R_{EMU}$. As described above with reference to FIG. 8, the emulation resistor $R_{EMU}$ may have a resistance within the range of resistances exhibited by an MTJ element MTJ of a memory cell Mi. The third transistor T3 may have a drain connected to the voltage buffer 410, a gate to which a bias voltage $V_{BIAS}$ is applied, and a source connected to the emulation resistor $R_{EMU}$. In an embodiment, a resistance of the emulation resistor $R_{EMU}$ is the same as one of the MTJ elements MTJ.

The first current mirror 430 is connected to the voltage buffer 410, and the emulation leakage current $\Sigma I_{LEAK3}$ generated when the voltage buffer 410 provides the second read voltage $V_{READ2}$ to a second column 120b may be provided from the first current mirror 430. Thus, the first current mirror 430 may generate a current $I_X$ having the same magnitude as the emulation leakage current $\Sigma I_{LEAK3}$ and provide the current $I_X$ to the second current mirror 440. As shown in FIG. 9, the first current mirror 430 includes a fourth transistor T4 and a fifth transistor T5, which have respective gates connected to each other. The fourth transistor T4 may have a source to which a positive supply voltage VDD is applied, a drain connected to the voltage buffer 410, and a gate connected to the drain. The fifth transistor may have a source to which the positive supply voltage VDD is applied, a gate connected to the gate of the fourth transistor T4, and a drain connected to the second current mirror 440.

The second current mirror 440 receives a current $I_X$ having the same magnitude as the emulation leakage current $\Sigma I_{LEAK3}$ from the first current mirror 430 and withdraws the compensation current $I_{COM}$ having the same magnitude as the current Ix from the outside. As shown in FIG. 9, the second current mirror 440 includes a sixth transistor T6 and a seventh transistor T7, which have respective gates connected to each other. The sixth transistor T6 may have a drain connected to the first current mirror 430, a gate connected to the drain, and a source to which a negative supply voltage VSS is applied. The seventh transistor T7 may have a drain configured to withdraw the compensation current $I_{COM}$ from the outside, a gate connected to the gate of the sixth transistor T6, and a source to which the negative supply voltage VSS is applied. In an embodiment, the seventh transistor T7 is located adjacent to a reference resistor (e.g., $R_{REF}$ in FIG. 6) to shorten a path through which the compensation current $I_{COM}$ moves and reduce a voltage drop on the path.

Figure 10:
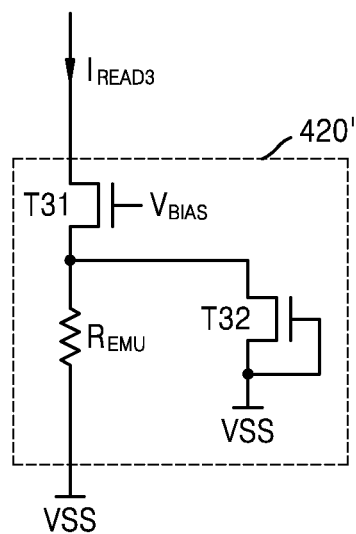
FIG. 10 is a circuit diagram of an emulation resistor circuit included in the compensation circuit of FIG. 1, according to an exemplary embodiment of the inventive concept.

FIG. 10 is a circuit diagram of an emulation resistor circuit included in the compensation circuit 400 of FIG. 1, according to an exemplary embodiment of the inventive concept. Specifically, the emulation resistor circuit 420' of FIG. 10 may replace the emulation resistor circuit 420 in the circuit diagram of FIG. 9. As compared with the emulation resistor circuit 420 of FIG. 9, the emulation resistor circuit 420' of FIG. 10 may further include a second transistor T32 connected in parallel to the emulation resistor $R_{EMU}$. In the following descriptions of FIG. 10, the same descriptions as in FIG. 9 will be omitted. FIG. 10 will be described with reference to FIGS. 6 and 9.

The emulation resistor circuit 420' includes a first transistor T31, a second transistor T32, and an emulation resistor $R_{EMU}$. The second transistor T32 may include a drain connected to the emulation resistor $R_{EMU}$ and a gate and source to which a negative supply voltage VSS is applied.

That is, the second transistor T32 is in a turn-off state. To generate the second read voltage $V_{READ2}$ corresponding to a first read voltage $V_{READ1}$, the second transistor T32 emulates unselected memory cells (e.g., M1 and Mn) in a first column 110b. As described above with reference to FIGS. 5 and 7, since the first read voltage $V_{READ1}$ may be reduced at a high temperature, a leakage current generated by the second transistor T32 at a high temperature may be used to generate a decreasing second read voltage $V_{READ2}$ at a high temperature like the first read voltage $V_{READ1}$. In an embodiment, the second transistor T32 has a greater size (i.e., channel width) than the first transistor T31. In an embodiment, unlike that shown in FIG. 10, the drain of the second transistor T32 is connected to the drain of the first transistor T31. In an embodiment, the emulation resistor circuit 420' further includes at least one other transistor connected to nodes (i.e., at least one transistor connected in parallel to the emulation resistor $R_{EMU}$) like the second transistor T32.

FIGS. 11A to 11D are plan views illustrating layouts of memory devices according to exemplary embodiments of the inventive concept. Specifically, FIGS. 11A to 11D illustrate the layouts of the memory devices in which off cell columns including off cells and compensation circuits configured to generate compensation currents using the off cell columns are differently located. In the following descriptions of FIGS. 11A to 11D, repeated descriptions will be omitted.

Figure 11A:
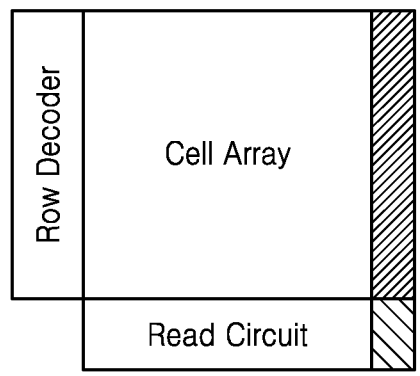
FIGS. 11A to 11D are plan views illustrating layouts of memory devices according to exemplary embodiments of the inventive concept.

Referring to FIG. 11A, a memory device 11a includes a cell array, a row decoder, and a read circuit, and the row decoder and the read circuit are located adjacent to the cell array. The row decoder may generate voltages applied to word lines, which extend in a row direction (i.e., a lateral direction), while the read circuit applies read currents to bit lines, which extend in a column direction (i.e., a longitudinal direction) and detect voltages of the bit lines. In an embodiment, as shown in FIG. 11A, the cell array includes an off cell column located on a side surface opposite to a side surface adjacent to the row decoder. In addition, as shown in FIG. 11A, the compensation circuit is located adjacent to the off cell column on a side surface of the read circuit.

Figure 11B:
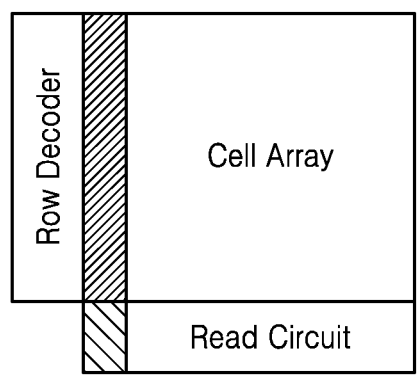

Referring to FIG. 11B, in an embodiment, in a memory device 11b, a cell array includes an off cell column located on a side surface adjacent to a row decoder, and a compensation circuit is located adjacent to the off cell column and a read circuit. Also, referring to FIG. 11C, in an embodiment, in a memory device 11c, an off cell column is located in the center of a cell array, and a compensation circuit is located adjacent to the off cell column in the center of a read circuit.

Figure 11C:
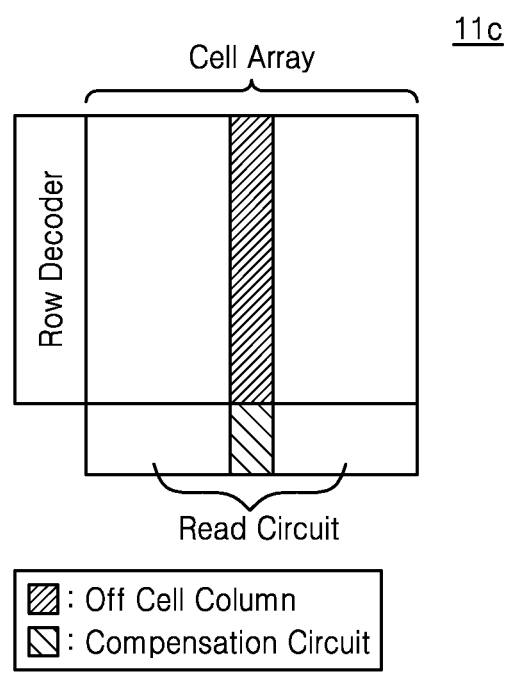
Figure 11D:
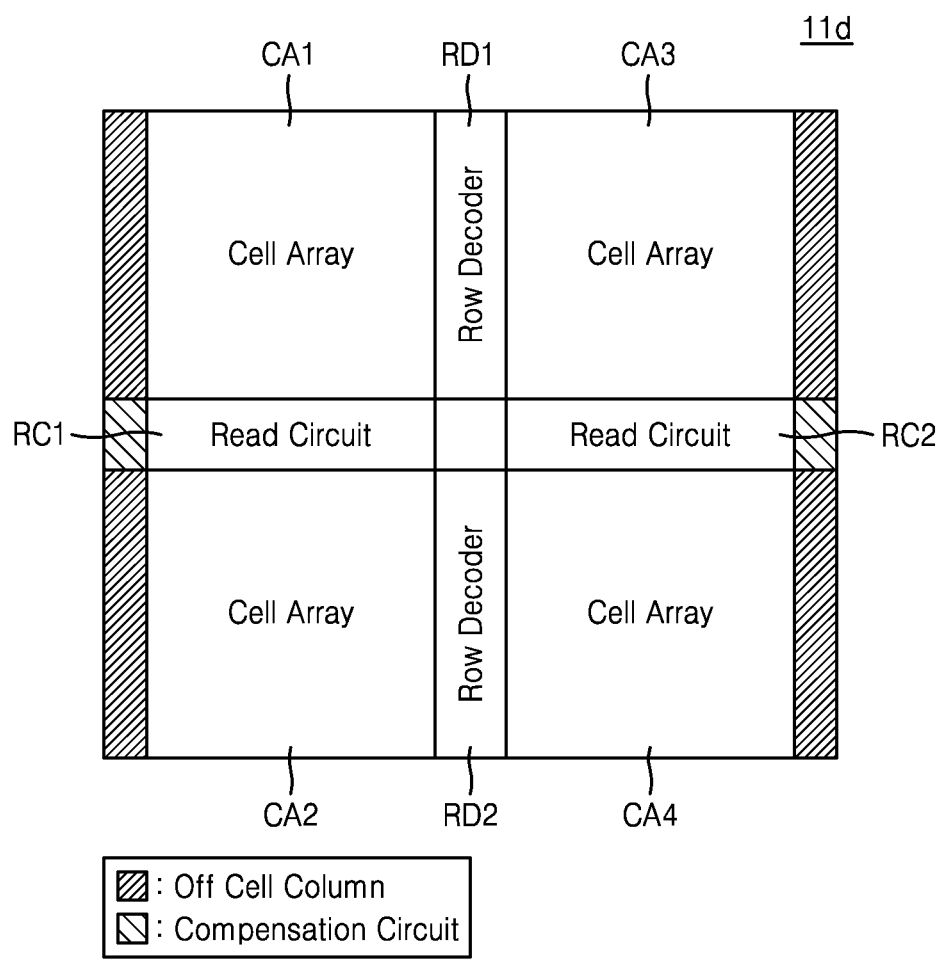

Referring to FIG. 11D, in an embodiment, a memory device 11d includes a plurality of cell arrays, each of which includes an off cell column. As shown in FIG. 11D, the memory device 11d includes first to fourth cell arrays CA1 to CA4, and each of the first to fourth cell arrays CA1 to CA4 may be referred to as a bank. Also, the memory device 11d includes first and second row decoders RD1 and RD2 and first and second read circuits RC1 and RC2, which are located among the first to fourth cell arrays CA1 to CA4. For instance, as shown in FIG. 11D, the first cell array CA1 includes an off cell column located on a side surface opposite to a side surface adjacent to the first row decoder RD1, and a compensation circuit is located adjacent to the off cell column. In an integrated circuit (IC) including a plurality of cell arrays, off cell columns and compensation circuits may be located in regions unlike those shown in FIG. 11D, for example, as shown in FIGS. 11A to 11C.

Figure 12:
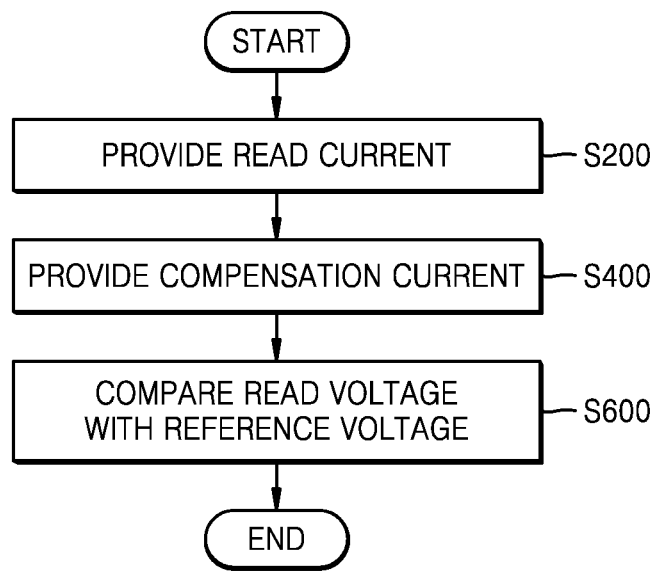
FIG. 12 is a flowchart of a method of operating a resistive memory device according to an exemplary embodiment of the inventive concept.

FIG. 12 is a flowchart of a method of operating a resistive memory device according to an exemplary embodiment of the inventive concept. Specifically, the flowchart of FIG. 12 illustrates a read operation of the resistive memory device. For example, the method of FIG. 12 may be performed by the memory device 10 of FIG. 1. Hereinafter, FIG. 12 will be described with reference to FIG. 1.

In operation S200, an operation of providing a read current is performed. For example, the read circuit 300 generates a first read current $I_{READ1}$, a second read current $I_{READ2}$, and a third read current $I_{READ3}$, which have the same magnitude, and provides the first read current $I_{READ1}$, the second read current $I_{READ2}$, and the third read current $I_{READ3}$ to each of the cell array 100 and/or the compensation circuit 400. An example of operation S200 will be described below with reference to FIG. 13.

In operation S400, an operation of providing a compensation current is performed. For example, the compensation circuit 400 generates a compensation current $I_{COM}$ using a second column 120 including a plurality of off cells F1 to Fn to compensate for a leakage current generated by unselected memory cells (e.g., M1 and Mn) in a first column 110 including a plurality of memory cells M1 to Mn. An example of operation S400 will be described below with reference to FIG. 14.

In operation S600, an operation of comparing a read voltage with a reference voltage is performed. For example, a first read voltage $V_{READ1}$ is generated by the first read current $I_{READ1}$ and the first column 110, and a reference voltage $V_{REF}$ is generated by a reference current $I_{REF}$ and a reference resistor (e.g., $R_{REF}$ of FIG. 6). Although the first read voltage $V_{READ1}$ may be reduced at a high temperature due to the leakage current of the unselected memory cells (e.g., M1 and Mn), the reference voltage $V_{REF}$ may also be reduced at a high temperature due to the reference current $I_{REF}$ reduced due to the compensation current $I_{COM}$ generated in operation S400. Accordingly, a voltage difference between the reference voltage $V_{REF}$ and the first read voltage $V_{READ1}$ may be maintained even at a high temperature, and errors in the read operation may be prevented.

Figure 13:
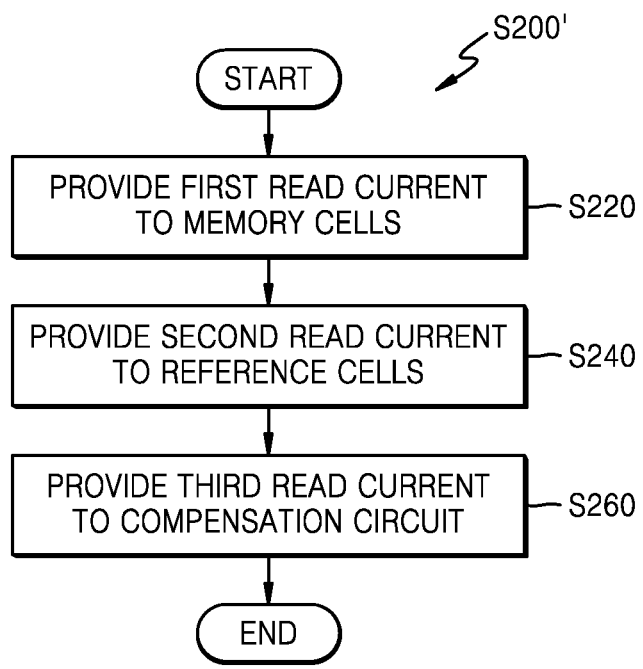
FIG. 13 is a flowchart of an example of operation S200 of FIG. 12, according to an exemplary embodiment of the inventive concept.

FIG. 13 is a flowchart of an example of operation S200 of FIG. 12, according to an exemplary embodiment of the inventive concept. As described above with reference to FIG. 12, in operation S200' of FIG. 13, an operation of providing a read current is performed. As shown in FIG. 13, operation S200' includes a plurality of operations S220, S240, and S260. At least two of the plurality of operations S220, S240, and S260 may be performed in parallel. Hereinafter, FIG. 13 will be described with reference to FIG. 6.

In operation S220, an operation of providing a first read current $I_{READ1}$ to memory cells is performed. For example, a read circuit 300*b* provides the first read current $I_{READ1}$ through a bit line BLi to a first column 110*b* including a plurality of memory cells M1 to Mn. Part (e.g., $\Sigma I_{LEAK1}$) of the first read current $I_{READ1}$ passes through unselected memory cells (e.g., M1 and Mn), while the remaining part (e.g., $I_{MTJ}$) of the first read current $I_{READ1}$ may pass through a selected memory cell Mi.

In operation S240, an operation of providing a second read current $I_{READ2}$ to reference cells is performed. For example, the read circuit 300*b* provides the second read current $I_{READ2}$ through a bit line BLr to a third column 130*b* including a plurality of reference cells R1 to Rn. The second read current $I_{READ2}$ flows through the plurality of reference cells R1 to Rn and a source line SLr to a reference resistor $R_{REF}$.

In operation S260, an operation of providing a third read current $I_{READ3}$ to a compensation circuit is performed. For example, the read circuit 300*b* may provide the third read current $I_{READ3}$ having the same magnitude as the first read current $I_{READ1}$ and/or the second read current $I_{READ2}$ to the compensation circuit 400*b*, and the third read current $I_{READ3}$ may be used for the compensation circuit 400*b* to generate a compensation current $I_{COM}$.

Figure 14:
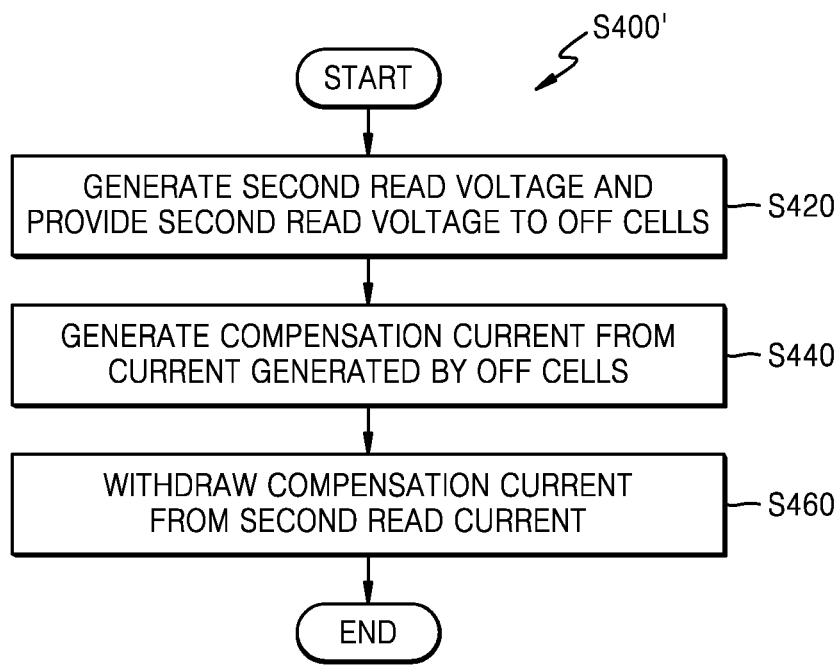
FIG. 14 is a flowchart of an example of operation S400 of FIG. 12, according to an exemplary embodiment of the inventive concept.

FIG. 14 is a flowchart of an example of operation S400 of FIG. 12, according to an exemplary embodiment of the inventive concept. As described above with reference to FIG. 12, in operation S400' of FIG. 14, an operation of providing a compensation current is performed. As shown in FIG. 14, operation S400' includes a plurality of operations S420, S440, and S460. Hereinafter, FIG. 14 will be described with reference to FIG. 6.

In operation S420, an operation of generating a second read voltage $V_{READ2}$ and providing the second read voltage $V_{READ2}$ to off cells is performed. For example, a compensation circuit 400*b* generates the second read voltage $V_{READ2}$ corresponding to a first read voltage $V_{READ1}$ based on a third read current $I_{READ3}$. The compensation circuit 400*b* provides the second read voltage $V_{READ2}$ to a second column 120*b* including a plurality of off cells F1 to Fn to cause an emulation leakage current $\Sigma I_{LEAK3}$ corresponding to the sum $\Sigma I_{LEAK2}$ of second leakage currents generated by a first column 110*b*.

In operation S440, an operation of generating a compensation current $I_{COM}$ from current caused by the off cells is performed. For example, by using a current mirror, the compensation circuit 400*b* generates the compensation current $I_{COM}$ having the same magnitude as a leakage current (i.e., the emulation leakage current $\Sigma I_{LEAK3}$) generated by providing the second read voltage $V_{READ2}$.

In operation S460, an operation of withdrawing the compensation current $I_{COM}$ from the second read current $I_{READ2}$ is performed. For example, the compensation circuit 400*b* may function as a current sink configured to withdraw the compensation current $I_{COM}$. The compensation circuit 400*b* may withdraw the compensation current $I_{COM}$ from the second read current $I_{READ2}$ so that a compensated reference current $I_{REF}$ passes through a reference resistor $R_{REF}$.

Figure 15:
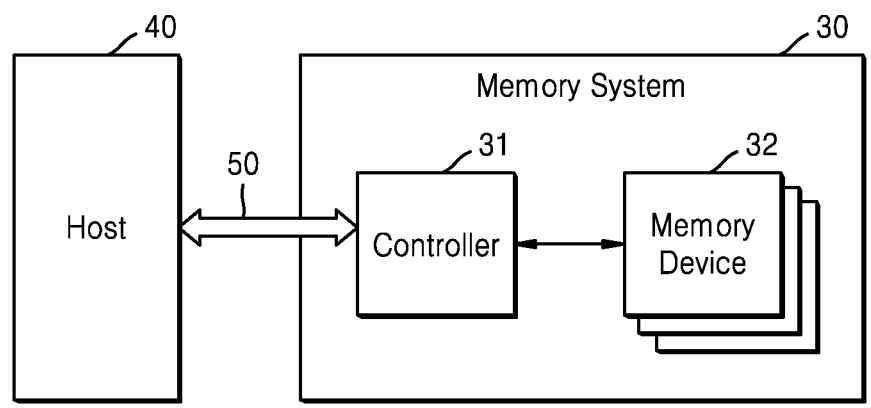
FIG. 15 is a block diagram of a memory system including a memory device according to an exemplary embodiment of the inventive concept.

FIG. 15 is a block diagram of a memory system 30 including a memory device 32 according to an exemplary embodiment of the inventive concept. As shown in FIG. 15, the memory system 30 may communicate with a host 40 and include a controller 31 and the memory device 32.

An interface 50 through which the memory system 30 and the host 40 communicate with each other may use an electric signal and/or an optical signal. The interface 50 may be implemented as a serial advanced technology attachment (SATA) interface, a SATA express (SATA-E) interface, a serial attached small computer system interface (serial attached SCSI or SAS), a peripheral component interconnect express (PCI-E) interface, a non-volatile memory express (NVM-E) interface, an advanced host controller interface (AHCI), or a combination thereof, but the inventive concept is not limited thereto.

In an embodiment, the memory system 30 is removably combined with the host 40 and communicates with the host 40. The memory device 320, which is a resistive memory, may be a non-volatile memory, and the memory system 30 may be referred to as a storage system. For example, the memory system 30 may be implemented as a solid-state drive or solid-state disk (SSD), an embedded SSD (eSSD), a multimedia card (MMC), or an embedded multimedia card (eMMC), but the inventive concept is not limited thereto.

The controller 31 may control the memory device 32 in response to a request received from the host 40 through the interface 50. For example, the controller 31 may write data, which is received together with a write request, in response to the write request or provide data stored in the memory device 32 to the host 40 in response to a read request.

The memory system 30 may include at least one memory device 32, and the memory device 32 may include memory cells, reference cells, and off cells. The memory cells and the reference cells may each include a variable resistance element as shown in FIG. 6. As described above, in an operation of reading the memory cell included in the memory device 32, the influence of a leakage current caused by unselected memory cells may be compensated. Thus, a value stored in the memory cell may be precisely read despite PVT variations. As a result, operating speed and operating reliability of the memory system 30 may be enhanced.

Figure 16:
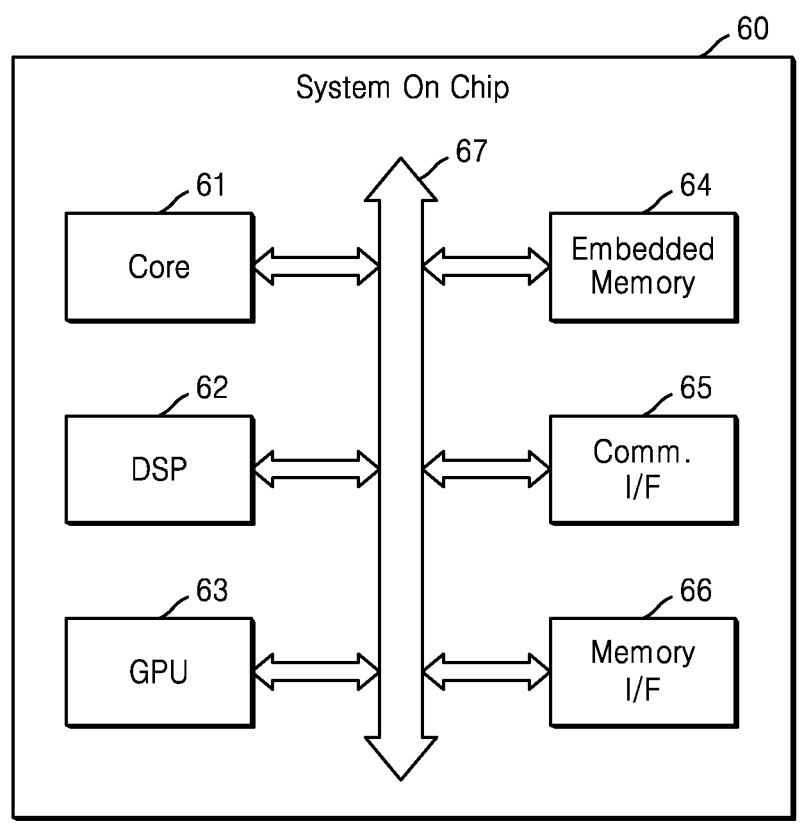
FIG. 16 is a block diagram of a System-on-Chip (SoC) including a memory device according to an exemplary embodiment of the inventive concept.

FIG. 16 is a block diagram of a System-on-Chip (SoC) 60 including a memory device according to an exemplary embodiment of the inventive concept. The SoC 60 may refer to an IC in which components of a computing system or another electronic system are integrated. For example, an application processor (AP), which includes SoC 60, may include a processor and other functional components. As shown in FIG. 14, the SoC 60 may include a core 61, a digital signal processor (DSP) 62, a graphic processing unit (GPU) 63, an embedded memory 64, a communication interface 65, and a memory interface 66. Components of the SoC 60 may communicate with each other through a bus 67.

The core 61 may process commands and control operations of the components included in the SoC 60. For example, the core 61 may process a series of commands, drive an operating system (OS), and execute applications on the OS. The DSP 62 may process a digital signal, for example, a digital signal provided from the communication interface 65, and generate useful data. The GPU 63 may generate data for an image output through a display device, based on image data provided from the embedded memory 64, or the memory interface 66 or encode image data.

The embedded memory 64 may store data required to operate the core 61, the DSP 62 and the GPU 63. The embedded memory 64 may include a resistive memory device according to an exemplary embodiment of the inventive concept. Thus, the embedded memory 64 may precisely read a value stored in a memory cell despite PVT variations. As a result, operating speed and operating reliability of the memory system 30 may be enhanced. The embedded memory 64 may have improved reliability.

The communication interface 65 may provide an interface for a communication network or one-to-one communication. The memory interface 66 may provide an interface for an external memory of the SoC 60, for example, dynamic random access memory (DRAM) and flash memory.

Figure 17:
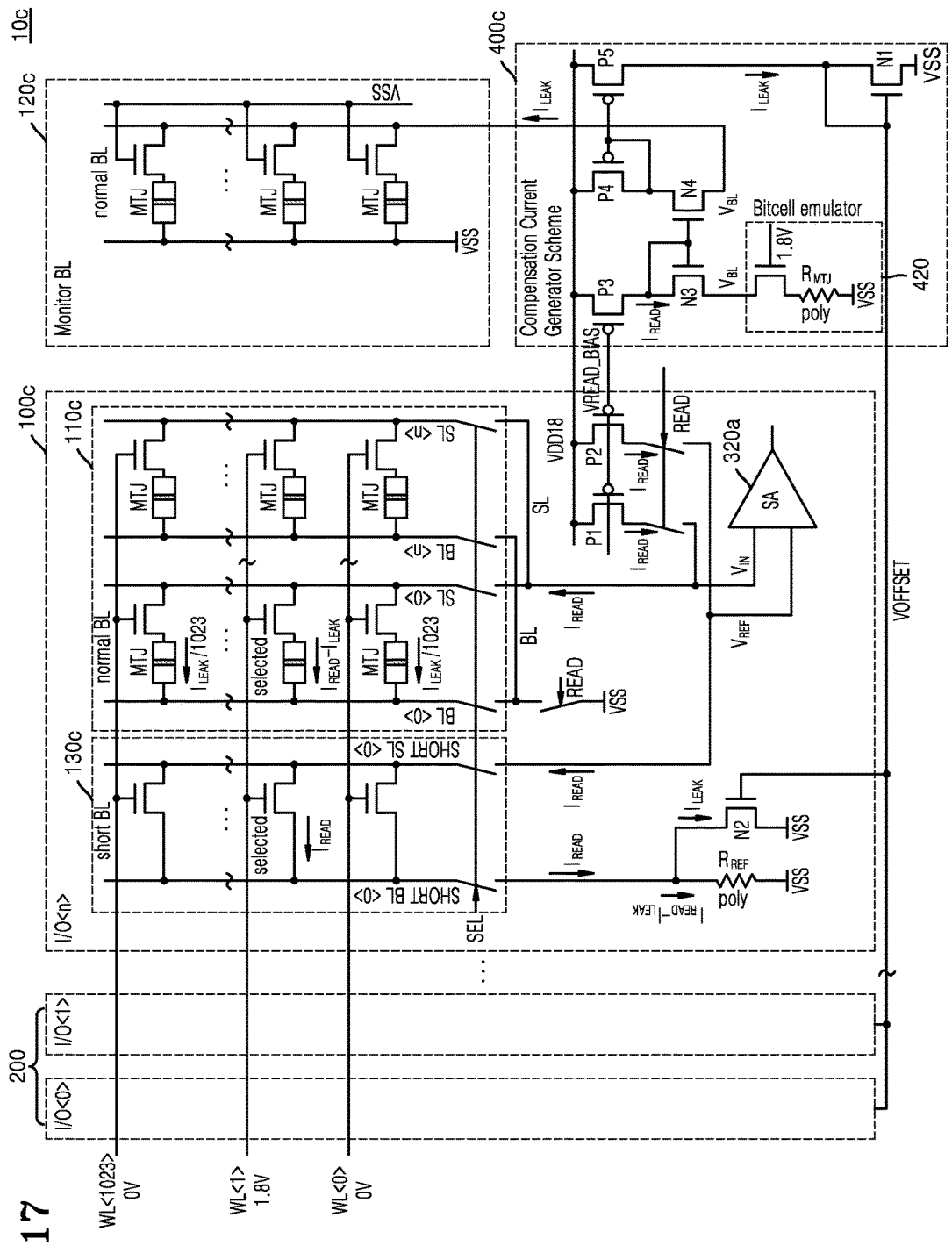
FIG. 17 illustrates a block diagram of a memory device 10d on which a read operation is performed, according to an exemplary embodiment of the inventive concept.

FIG. 17 illustrates a block diagram of a memory device 10c on which a read operation is performed, according to an exemplary embodiment of the inventive concept. The memory device 10c includes a row decoder 200, a cell array 100c, and off cells 120c, which may be included within the cell array 100c. The cell array 100c further includes memory cells 110c and reference cells 130c. The cell array 100c may further include a sense amplifier 320a that receives a reference voltage $V_{REF}$ from the reference cells 130c and receives an input voltage $V_{in}$ from the memory cells 110c when the second word line WL<1> is activated to read from a corresponding memory cell. For example, a first voltage (e.g., 1.8 volts) can be applied to a word line to select a given memory cell for reading, while the other memory cells remain unselected due to application of a second voltage (e.g., 0 volts) to their respective word lines (e.g., WL<0>, WL<1023>). An output of the voltage sense amplifier may be used to determine a value stored in the selected memory cell.

The memory device 10c further includes a compensation circuit 400c to compensate for leakage current generated by the reference cells 130c. The compensation circuit 400c includes a first NMOS transistor N1 receiving a supply voltage VSS, where a gate of the first NMOS transistor N1 provides an offset voltage VOFFSET to a gate of a second NMOS transistor N2 connected between the supply voltage VSS and the reference resistor $R_{REF}$. The compensation circuit 400c further includes an emulation resistor circuit 420, a third NMOS transistor N3, and a fourth NMOS transistor N4.

A supply voltage VDD18 is applied to the compensation circuit 400c from a read bias circuit, which includes a first PMOS transistor P1 and a second PMOS transistor P2. The first PMOS transistor P1 is connected between a node receiving the supply voltage VDDD18 and a node connected to an input of the amplifier 320a outputting the input voltage $V_{IN}$. The second PMOS transistor P2 is connected between a node receiving the supply voltage VDD18 and a node connected to an input of the amplifier 320b outputting the reference voltage $V_{REF}$.

The compensation circuit 400c further includes a third PMOS transistor P3, a fourth PMOS transistor P4 and a fifth PMOS transistor P5. A read bias voltage VREAD_BIAS is applied to the gates of the first through third PMOS transistors P1-P3.

Figure 18:
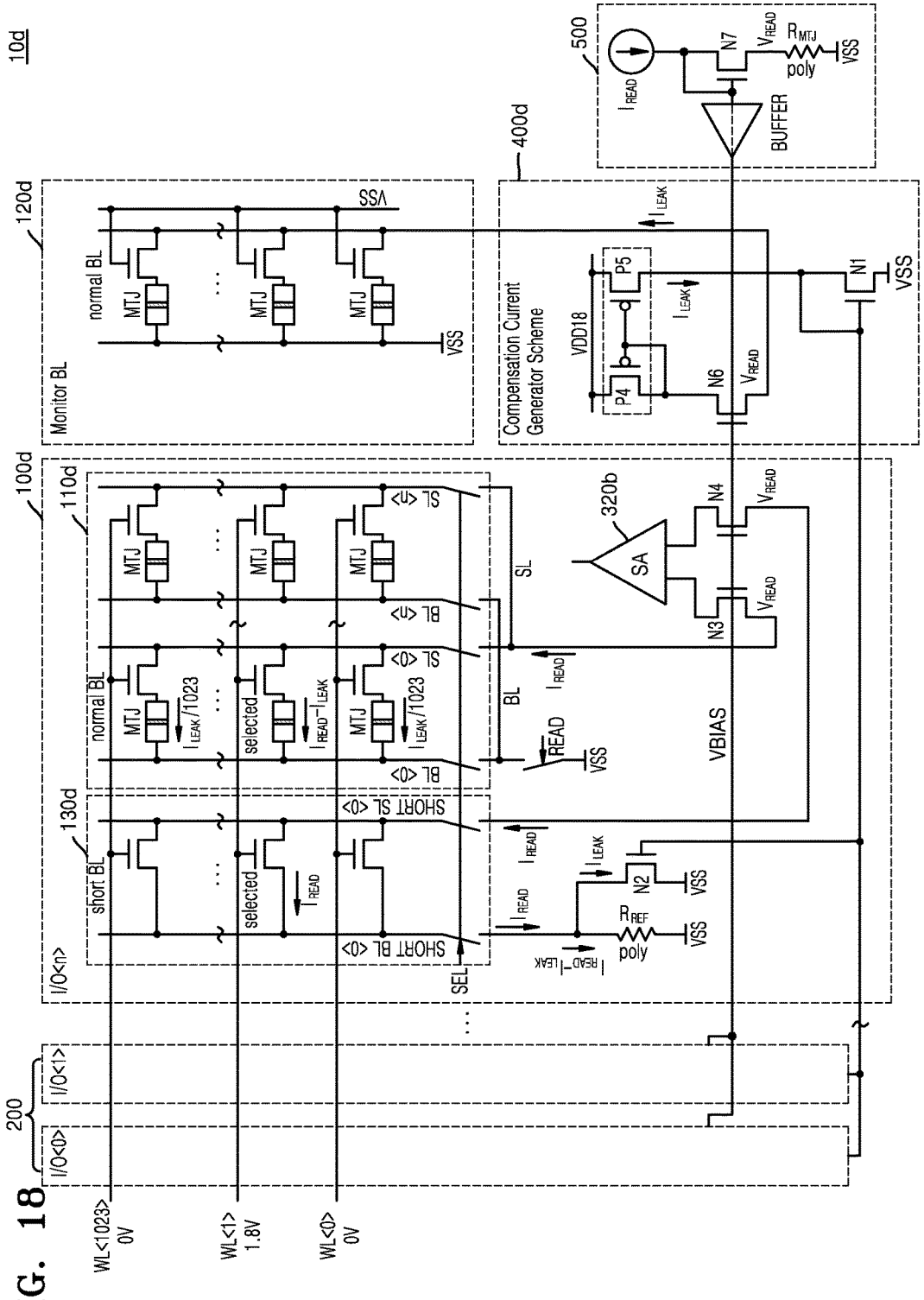
FIG. 18 illustrates a block diagram of a memory device 10d on which a read operation is performed, according to an exemplary embodiment of the inventive concept.

FIG. 18 illustrates a block diagram of a memory device 10d on which a read operation is performed, according to an exemplary embodiment of the inventive concept. The memory device 10d includes a row decoder 200, a cell array 100d, and off cells 120d, which may be included within the cell array 100d. The cell array 100d further includes memory cells 110d and reference cells 130d. The cell array 100d may further include a sense amplifier 320b that receives a first read voltage from the reference cells 130d and receives a second read voltage from the memory cells 110d when the second word line WL<1> is activated to read from a corresponding memory cell.

The memory device 10d further includes a compensation circuit 400d to compensate for leakage current generated by the reference cells 130d. The compensation circuit 400d includes a first NMOS transistor N1 receiving a supply voltage VSS, where a gate of the first NMOS transistor N1 provides a signal to a gate of a second NMOS transistor N2 connected between the supply voltage VSS and the reference resistor $R_{REF}$.

A third NMOS transistor N3 is present between a first input of the sense amplifier 320b and a node receiving a read voltage from the memory cells 110d. A fourth NMOS transistor N4 is present between a second input of the sense amplifier 320b and a node receiving a read voltage from the reference cells 130d.

The compensation circuit 400d further includes a fourth PMOS transistor P4 receiving supply voltage VDD18, a fifth PMOS transistor P5 receiving the supply voltage VDD18, and a sixth NMOS transistor N6 connected to the off cells 120d.

A voltage buffer 500 applies a bias voltage VBIAS to the third NMOS transistor N3, the fourth NMOS transistor N4, and the sixth NMOS transistor N6. The voltage buffer 500 may include a current source, a buffer, a seventh NMOS transistor, and resistor having a resistance in a same range as that of the variable resistance element MTJ.

It will be understood by those of ordinary skill in the art that various changes in form and details may be made to the disclosed embodiments without departing from the spirit and scope of the inventive concept.

What is claimed is:

1. A resistive memory device comprising:
   a plurality of word lines;
   a plurality of reference cells, where each reference cell is connected to one of the word lines;
   a plurality of first resistive memory cells, where each first resistive memory cell is connected to one of the word lines;
   a plurality of second resistive memory cells maintained in an off state;
   a read circuit configured to provide a first read current to the first resistive memory cells and provide a second read current to the reference cells while one of the first resistive memory cells is selected to perform a read operation; and
   a compensation circuit configured to withdraw a compensation current from the reference cells based on a first leakage current generated by the second resistive memory cells to compensate for a second leakage current generated by the unselected first resistive memory cells.

2. The resistive memory device of claim 1,
   wherein each of the resistive memory cells and each of the reference cells comprise a cell transistor, each of the resistive memory cells further comprising a variable resistive element,
   wherein a gate of the cell transistor of each of the first resistive memory cells and each of the reference cells is connected to one of the word lines, and
   wherein a gate of the cell transistor of each of the second resistive memory cells is connected to a node receiving a constant voltage.

3. The resistive memory device of claim 2, further comprising a row decoder configured to apply a first voltage to the word line connected to the one selected first resistive memory cell and apply a second voltage to the remaining word lines, where the constant voltage is the second voltage, and the first and second voltages differ from one another.

4. The resistive memory device of claim 3, wherein the first voltage turns on the cell transistor of the one selected first resistive memory cell, and the second voltage turns off the cell transistors of the unselected first resistive memory cells and the turns off the cell transistors of the second resistive memory cells.

5. The resistive memory device of claim 1, wherein the read circuit performs the read operation by comparing a reference voltage based on the second read current and a first read voltage based on the first read current, where a value stored in the one selected first resistive memory cell is derivable from an output of the comparing.

6. The resistive memory device of claim 2, further comprising a reference resistor connected between the reference cells and a node receiving the constant voltage, wherein the reference resistor is connected to the compensation circuit through a signal line that enables the compensation circuit to withdraw the compensation current from the reference cells.

7. The resistive memory device of claim 6, wherein the variable resistive element has a first resistance to represent a logic 0 and a second different resistance to represent a logic 1, and a resistance of the reference resistor is an average of the first and second resistances.

8. The resistive memory device of claim 1, wherein the compensation circuit comprises:
   a voltage buffer;
   an emulation resistor circuit connected to the voltage buffer;
   a first current mirror connected to the voltage buffer; and
   a second current mirror connected to the first current mirror and configured to generate the compensation current.

9. The resistive memory device of claim 8, wherein the emulation resistor circuit includes an emulation resistor having a resistance in a range exhibited by resistors of a same type as a variable resistance element.

10. The resistive memory device of claim 1, wherein the first resistive memory cells are arranged into a first column, the second resistive memory cells are arranged into a second column, and the first column is located between a row decoder and the second column.

11. The resistive memory device of claim 1, wherein the first resistive memory cells are arranged into a first column, the second resistive memory cells are arranged in a second column, and the second column is located between a row decoder and the first column.

12. The resistive memory device of claim 1, wherein the first resistive memory cells are arranged into a first column, the second resistive memory cells are arranged in a second column, and the second column is located between the first column and a third column comprising another plurality of resistive memory cells connected to the word line.

13. A resistive memory device comprising:
    a plurality of word lines;
    a plurality of reference cells, where each reference cell is connected to one of the word lines;
    a plurality of first resistive memory cells, where each first resistive memory cell is connected to one of the word lines;
    a plurality of second resistive memory cells maintained in an off state;
    a read circuit configured to provide a first read current to the first resistive memory cells and provide a second read current to the reference cells while one of the first resistive memory cells is selected to perform a read; and
    a compensation circuit configured to provide a compensation current based on a first leakage current from the second resistive memory cells to the reference cells to compensate for a second leakage current generated by the unselected first resistive memory cells.

14. The resistive memory device of claim 13, wherein a magnitude of the first read current is the same as a magnitude of the second read current.

15. The resistive memory device of claim 13, wherein the read circuit performs the read by comparing a reference voltage based on the second read current and a first read voltage based on the first read current, where a value stored in the one selected first resistive memory cell is derivable from an output of the comparing.

16. The resistive memory device of claim 13, wherein each reference cell comprises a cell transistor connected between a first bit line receiving the second read current and a first source line.

17. The resistive memory device of claim 16, further comprising a signal line connecting the first source line to the compensation circuit to receive the compensation current.

18. The resistive memory device of claim 16, wherein each of the first resistive memory cells includes a variable resistance element and a cell transistor connected between a second bit line and a second source line receiving a first supply voltage during the read.

19. The resistive memory device of claim 18, wherein each of the second resistive memory cells includes a variable resistance element and a cell transistor connected between a third bit line connected to the compensation circuit and a third source line receiving the first supply voltage.

20. The resistive memory device of claim 19, wherein a gate of each cell transistor of the second resistive memory cells receives the first supply voltage.

\* \* \* \* \*